(12) United States Patent
Wu et al.

(10) Patent No.: US 11,145,740 B2
(45) Date of Patent: Oct. 12, 2021

(54) FERROELECTRIC FIELD EFFECT TRANSISTOR DEVICE

(71) Applicant: National Tsing Hua University, Hsinchu (TW)

(72) Inventors: Yung-Chun Wu, Hsinchu (TW); Fu-Ju Hou, Hsinchu (TW); Meng-Ju Tsai, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/917,172

(22) Filed: Jun. 30, 2020

(65) Prior Publication Data
US 2021/0028292 A1  Jan. 28, 2021

(30) Foreign Application Priority Data

Jul. 23, 2019 (TW) ................................. 108125943
Apr. 21, 2020 (TW) ................................. 109113313

(51) Int. Cl.
*H01L 29/51* (2006.01)
*H01L 29/06* (2006.01)
(Continued)

(52) U.S. Cl.
CPC ........ *H01L 29/516* (2013.01); *H01L 21/0228* (2013.01); *H01L 21/02194* (2013.01);
(Continued)

(58) Field of Classification Search
CPC ............... H01L 29/516; H01L 29/0649; H01L 29/0673; H01L 29/41733; H01L 29/41791;
(Continued)

(56) References Cited

U.S. PATENT DOCUMENTS 6,984,591 B1 *  1/2006  Buchanan ......... C23C 16/45531
                                                        438/778
2013/0102116 A1 *  4/2013  Xiao .................. H01L 27/1211
                                                        438/157
(Continued)

FOREIGN PATENT DOCUMENTS

CN      109427877 A      3/2019
TW      201818507 A      5/2018
TW      201830694 A      8/2018

OTHER PUBLICATIONS

Su et al., "Nano-scaled Ge FinFETs with Low Temperature Ferroelectric HfZrOx on Specific Interfacial Layers Exhibiting 65% S.S. Reduction and Improved Ion," Symposium on VLSI Technology Digest of Technical Papers, 2017, 2 pages.
(Continued)

*Primary Examiner* — Tong-Ho Kim
(74) *Attorney, Agent, or Firm* — Birch, Stewart, Kolasch & Birch, LLP

(57) ABSTRACT

A ferroelectric field effect transistor (FeFET) device includes a semiconductor substrate and a 3D transistor. The 3D transistor includes drain and source electrodes; a channel structure that includes a channel body and a gate dielectric layer; and a gate electrode that is disposed on the gate dielectric layer and that is electrically isolated from the drain and source electrodes. The channel body is disposed between and connected to the drain and source electrodes. The gate dielectric layer covers the channel body, is made of crystalline hafnium zirconium oxide, and has a thickness ranging from 2 nm to 5 nm. The FeFET device has an on/off current ratio that is greater than $5\times10^4$.

14 Claims, 25 Drawing Sheets

(51) Int. Cl.
*H01L 29/423* (2006.01)
*H01L 29/49* (2006.01)
*H01L 29/786* (2006.01)
*H01L 29/417* (2006.01)
*H01L 21/02* (2006.01)
*H01L 21/3065* (2006.01)
*H01L 21/265* (2006.01)
*H01L 21/28* (2006.01)
*H01L 29/66* (2006.01)
*H01L 29/78* (2006.01)

(52) U.S. Cl.
CPC .. *H01L 21/02532* (2013.01); *H01L 21/02603* (2013.01); *H01L 21/26513* (2013.01); *H01L 21/28158* (2013.01); *H01L 21/3065* (2013.01); *H01L 29/0649* (2013.01); *H01L 29/0673* (2013.01); *H01L 29/41733* (2013.01); *H01L 29/41791* (2013.01); *H01L 29/42376* (2013.01); *H01L 29/42392* (2013.01); *H01L 29/4908* (2013.01); *H01L 29/513* (2013.01); *H01L 29/517* (2013.01); *H01L 29/66742* (2013.01); *H01L 29/66795* (2013.01); *H01L 29/785* (2013.01); *H01L 29/78603* (2013.01); *H01L 29/78684* (2013.01); *H01L 29/78696* (2013.01)

(58) Field of Classification Search
CPC ......... H01L 29/42376; H01L 29/42392; H01L 29/4908; H01L 29/513; H01L 29/517; H01L 29/66742; H01L 29/667; H01L 29/95; H01L 29/785; H01L 29/78603; H01L 29/78684; H01L 29/78696; H01L 21/02194; H01L 21/0228; H01L 21/02532; H01L 21/02603; H01L 21/26513; H01L 21/28158; H01L 21/3065
USPC ........................................................ 257/295
See application file for complete search history.

(56) References Cited

U.S. PATENT DOCUMENTS

2015/0340372 A1* 11/2015 Pandey ................ H01L 29/516
　　　　　　　　　　　　　　　　　　　　257/295
2019/0088760 A1* 3/2019 Lee ..................... H01L 29/6684

OTHER PUBLICATIONS

Taiwanese Search Report for Taiwanese Application No. 109113313, dated Feb. 22, 2021, with English translation.

* cited by examiner

FERROELECTRIC FIELD EFFECT TRANSISTOR DEVICE

CROSS-REFERENCE TO RELATED APPLICATION

This application claims priority of Taiwanese Invention Patent Application No. 108125943, filed on Jul. 23, 2019, and Taiwanese Invention Patent Application No. 109113313, filed on Apr. 21, 2020, which claims priority of Taiwanese Invention Patent Application No. 108125943.

FIELD

The disclosure relates to a field effect transistor (FET) device, and more particularly to a ferroelectric FET device.

BACKGROUND

With downsizing of portable electronic devices and rapid development of semiconductor manufacturing processes, recent researches have focused on three-dimensional (3D) fin-type field effect transistor (finFET) devices to replace planar FET devices. On the other hand, since a ferroelectric material having a high-k dielectric constant is capable of switching its polarization to exhibit a negative capacitance upon application of a critical voltage, utilization of the ferroelectric material in semiconductor devices, such as FET devices, can effectively reduce power consumption thereof.

Referring to FIGS. 1 and 2, a conventional semiconductor device including a regular FET and an negative capacitance FET (NC-FET), also called a ferroelectric FET (FeFET), is disclosed in Taiwanese Invention Patent Application Publication No. 201830694 A. The NC-FET includes a substrate 10 and a plurality of finFET elements 11. Each of the finFET elements 11 includes a fin structure 111 disposed on the substrate 10, an isolation insulating layer 112 formed in the fin structure 111, and an epitaxial source/drain structure 60 formed in the fin structure 111. The fin structures 111 of the finFET elements 11 are spaced apart along an X direction, and extend along a Y direction.

Each of the finFET elements 11 includes a lower part 1111 (i.e., a well region), an upper part 1112 (i.e., a channel region), an interlayer dielectric (ILD) layer 114, a common gate dielectric layer 115, a common work function adjustment metal (WFM) layer 116, an electric conductive layer 118, and a ferroelectric layer 120. The ILD layer 114 is disposed over the isolation insulating layer 112 and covers portions of the fin structures 11 in a cruciform arrangement. The gate dielectric layer 115 is formed on the upper parts 1112 of the fin structures 111, and the WFM layer 116 is formed on the gate dielectric layer 115. The electric conductive layer 118 is formed on the WFM layer 116. The ferroelectric layer 120 is formed on the electric conductive layer 118 by atomic layer deposition (ALD), and has a thickness ranging from 1 nm to 20 nm.

Despite rapid development of FeFET devices, there is still a need to develop FeFET devices with a reduced size and exhibiting improved electrical properties, such as desirable subthreshold swing (SS) and high on/off current ($I_{ON}/I_{OFF}$) ratio.

SUMMARY

Therefore, an object of the disclosure is to provide a ferroelectric field effect transistor (FeFET) device that can alleviate at least one of the drawbacks of the prior art.

The FeFET device includes a semiconductor substrate and a 3D transistor. The 3D transistor includes a drain electrode and a source electrode that are disposed on and extend in a direction away from the semiconductor substrate; a channel structure that includes a channel body and a gate dielectric layer; and a gate electrode that is disposed on the gate dielectric layer and that is electrically isolated from the drain electrode and the source electrode. The channel body extends in the direction away from the semiconductor substrate and is disposed between and connected to the drain and source electrodes. The gate dielectric layer covers the channel body, is made of crystalline hafnium zirconium oxide, and has a thickness ranging from 2 nm to 5 nm. The FeFET device has an on/off current ratio that is greater than $5\times10^4$.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
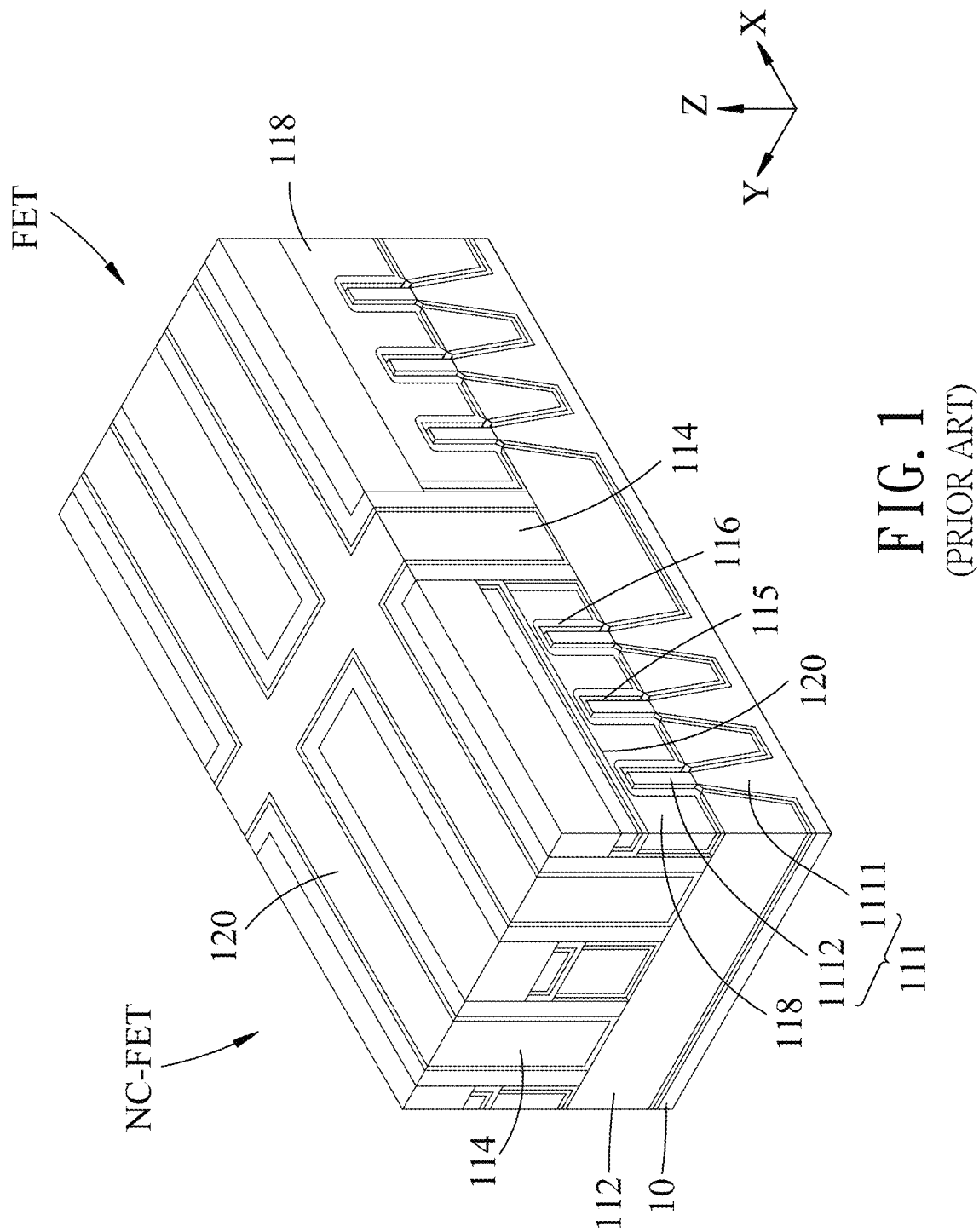
FIGS. 1 and 2 is a schematic perspective view illustrating a conventional semiconductor device including a regular field effect transistor (FET) and an negative capacitance FET (NC-FET)
Figure 2:
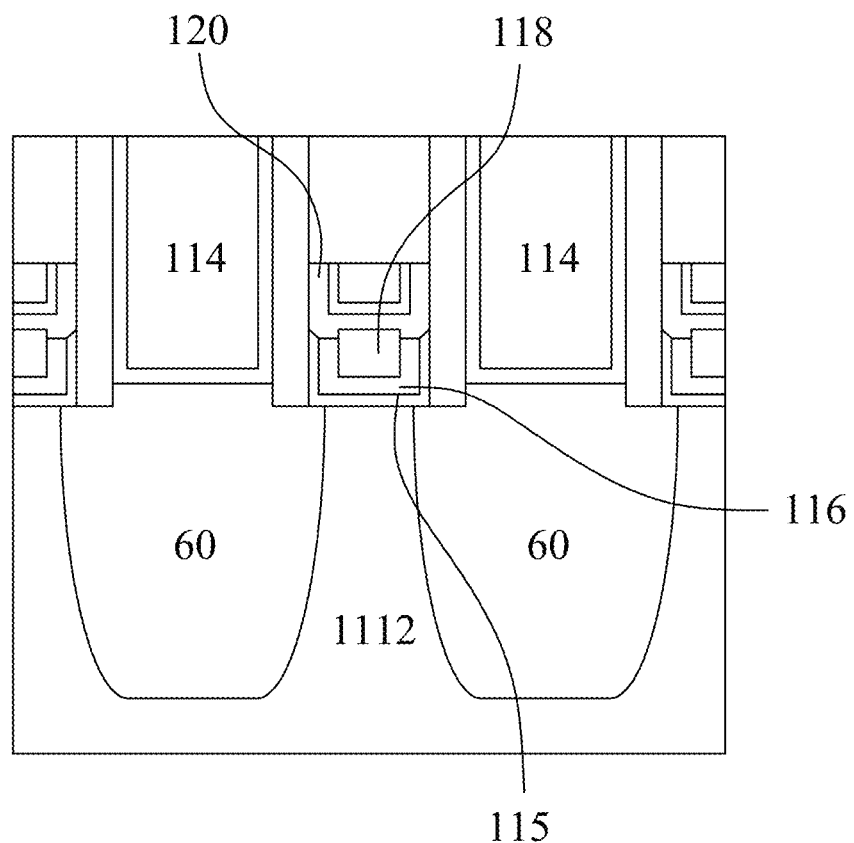

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
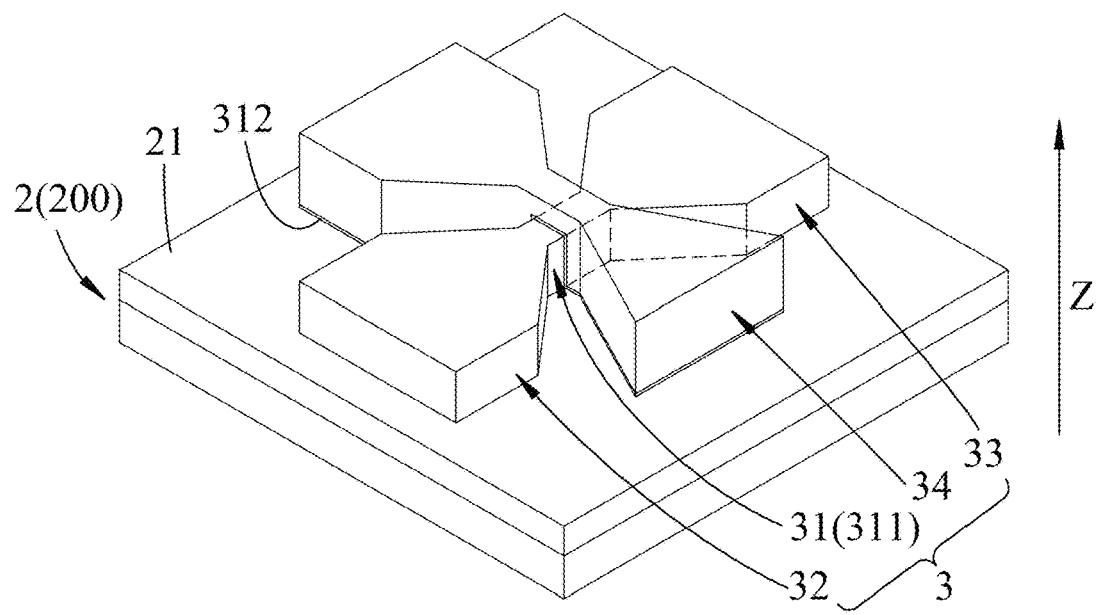
FIG. 3 is a schematic view illustrating a first embodiment of a ferroelectric FET (FeFET) device according to the disclosure.
Figure 4:
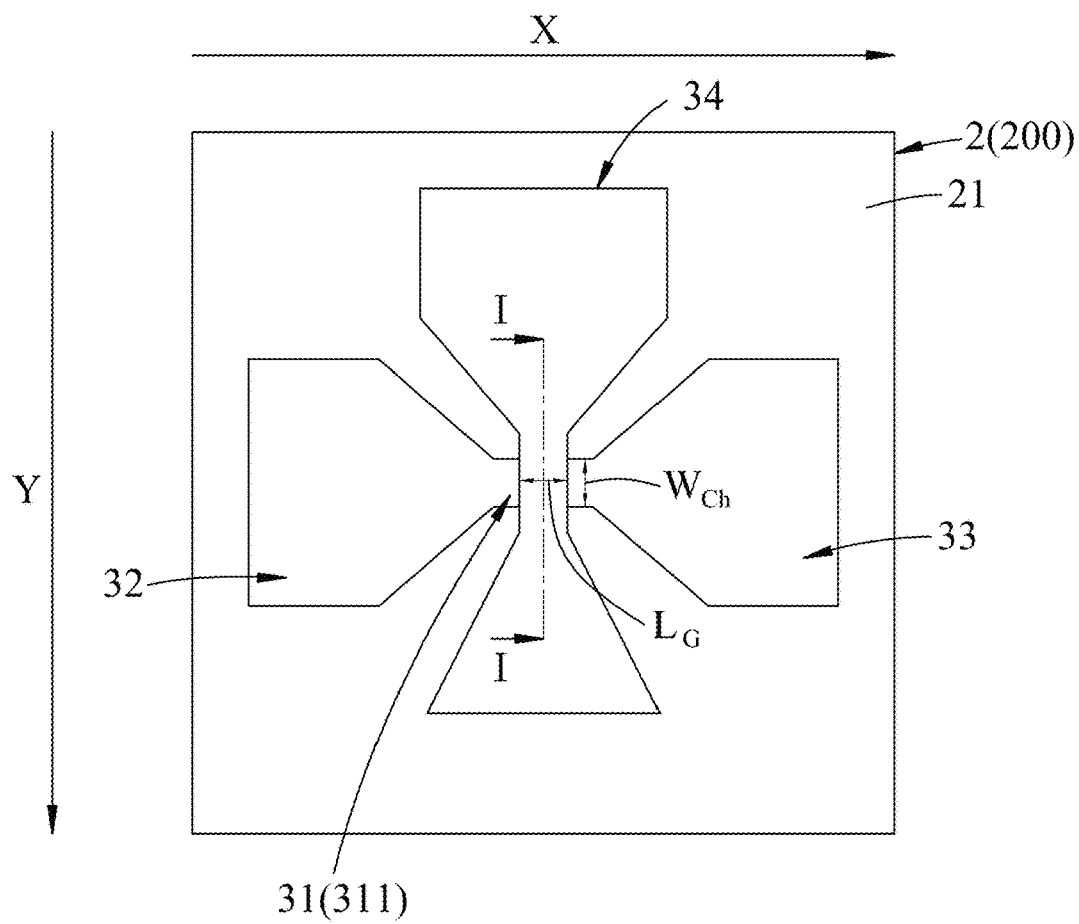
FIG. 4 is a top view of the first embodiment.
Figure 5:
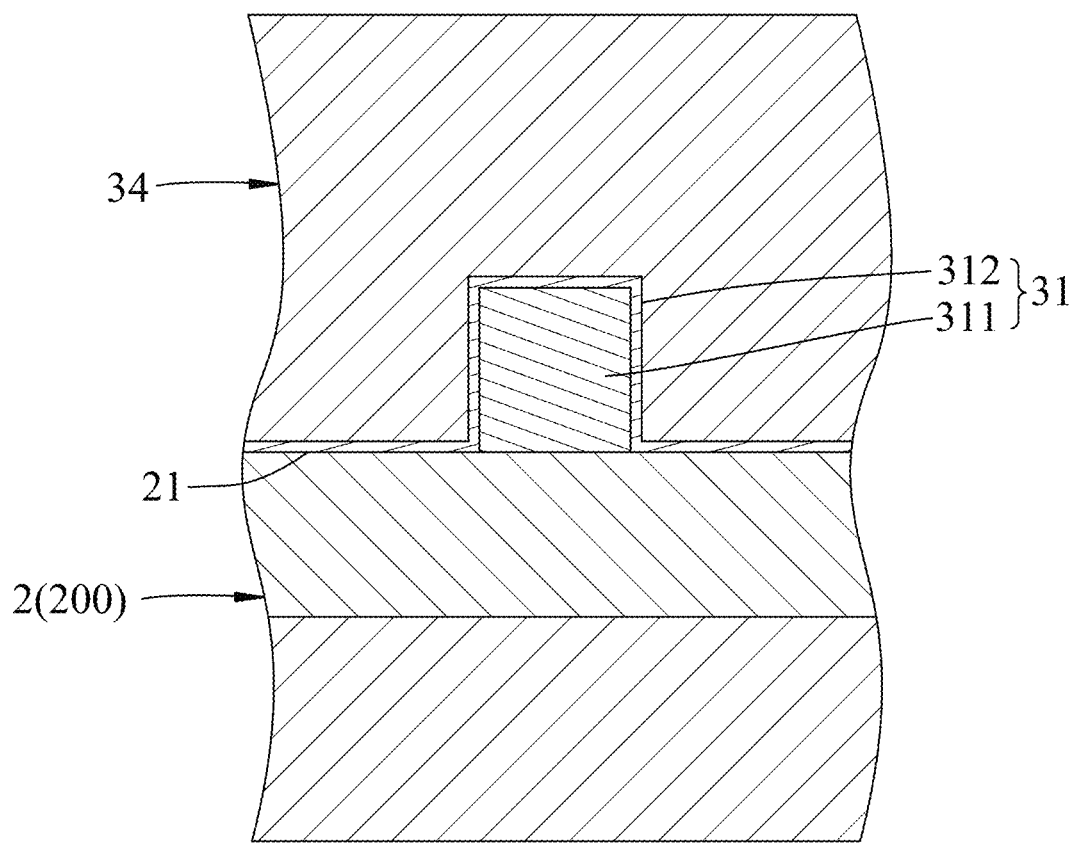
FIG. 5 is a cross sectional view of the first embodiment taken along line I-I of FIG. 4.

Referring to FIGS. 3 to 5, a first embodiment of a ferroelectric field effect transistor (FeFET) device according to the disclosure includes a semiconductor substrate 2 and a 3D transistor 3.

The 3D transistor 3 includes a channel structure 31, a drain electrode 32, a source electrode 33, and a gate electrode 34.

The drain electrode 32 and the source electrode 33 are disposed on and extend in a direction (Z) away from the semiconductor substrate 2 (i.e., Z-direction).

The channel structure 31 includes a channel body 311 and a gate dielectric layer 312. The channel body 311 extends in the direction away from the semiconductor substrate 2 (Z-direction) and is disposed between and connected to the drain electrode 32 and the source electrode 33. The gate dielectric layer 312 covers the channel body 311, and is made of crystalline hafnium zirconium oxide having a thickness ranging from 2 nm to 5 nm.

The gate electrode 34 is disposed on the gate dielectric layer 312 and is electrically isolated from the drain electrode 32 and the source electrode 33. The FeFET device has an on/off current ratio ($I_{ON}/I_{OFF}$) that is greater than $5 \times 10^4$.

Examples of the semiconductor substrate 2 may be, but are not limited to, a silicon wafer, a germanium wafer or a silicon-on-insulator (SOI) wafer. The channel body 311 of the channel structure 31 may be made of a material selected from the group consisting of silicon, germanium and silicon germanium compound. Each of the drain electrode 32 and the source electrode 33 may be made of the aforesaid material for making the channel body 311 and further doped with an impurity.

In the first embodiment, the semiconductor substrate 2 is made of a SOI wafer 200. The channel body 311 of the channel structure 31 is made of silicon and is directly disposed on and extends from the semiconductor substrate 2. Each of the drain electrode 32 and the source electrode 33 is made of silicon doped with an impurity. The FeFET device of this embodiment is a fin-type FET structure and has an on/off current ratio ($I_{ON}/I_{OFF}$) greater than $10^6$.

The gate electrode 34 has a gate length ($L_G$) measured along a first direction (X) from the drain electrode 32 to the source electrode 33. The gate length ($L_G$) may range from 10 nm to 500 nm (such as 100 nm and 500 nm). The channel body 311 has a channel width ($W_{Ch}$) measured along a second direction (Y) that is orthogonal to the first direction (X). The channel width ($W_{Ch}$) may range from 3 nm to 50 nm (such as 20 nm, 30 nm and 50 nm).

Figure 6:
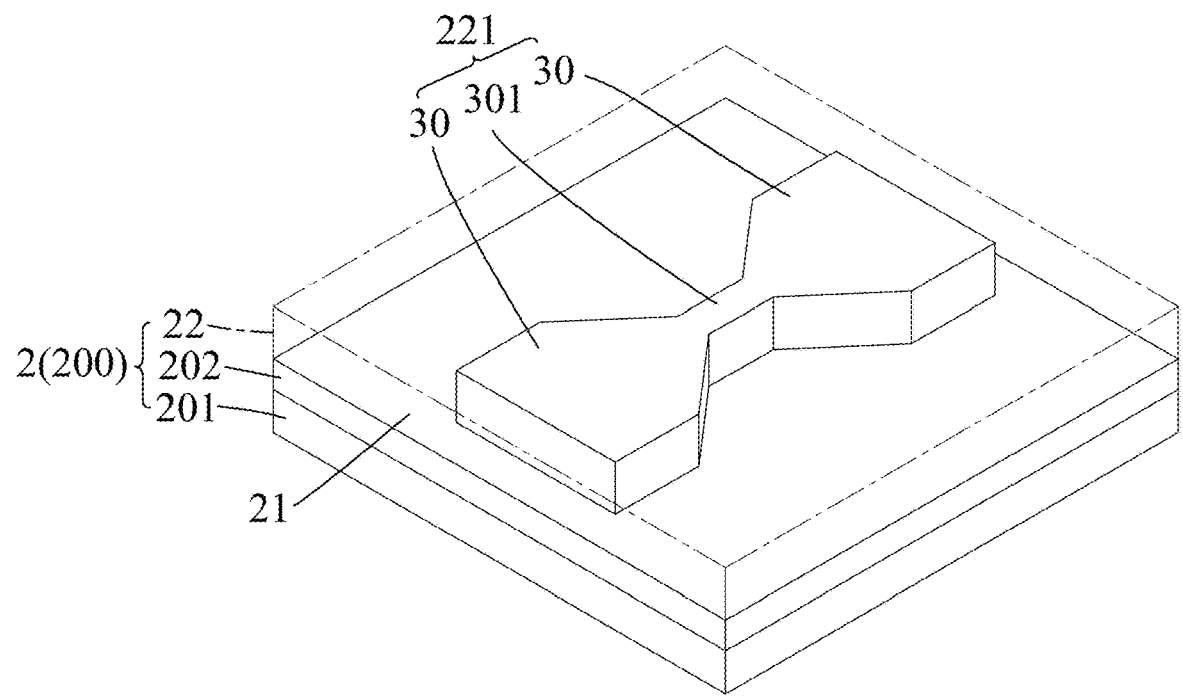
FIGS. 6 to 8 are schematic views illustrating consecutive steps for forming the first embodiment of the FeFET device according to the disclosure.
Figure 7:
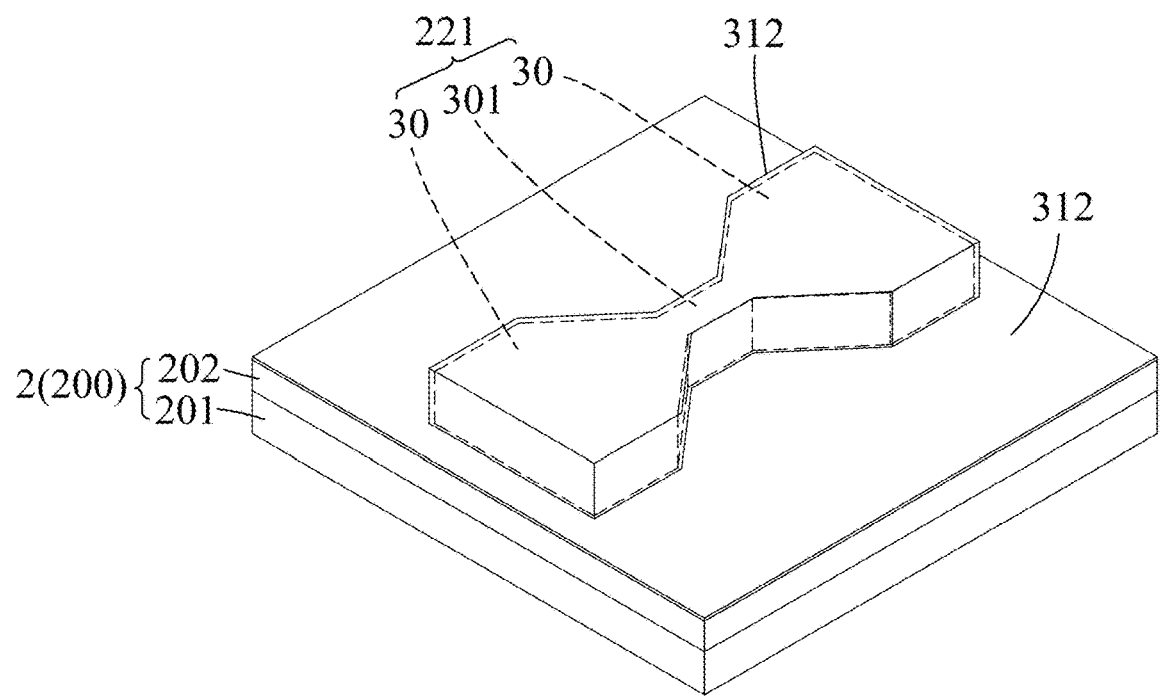
Figure 8:
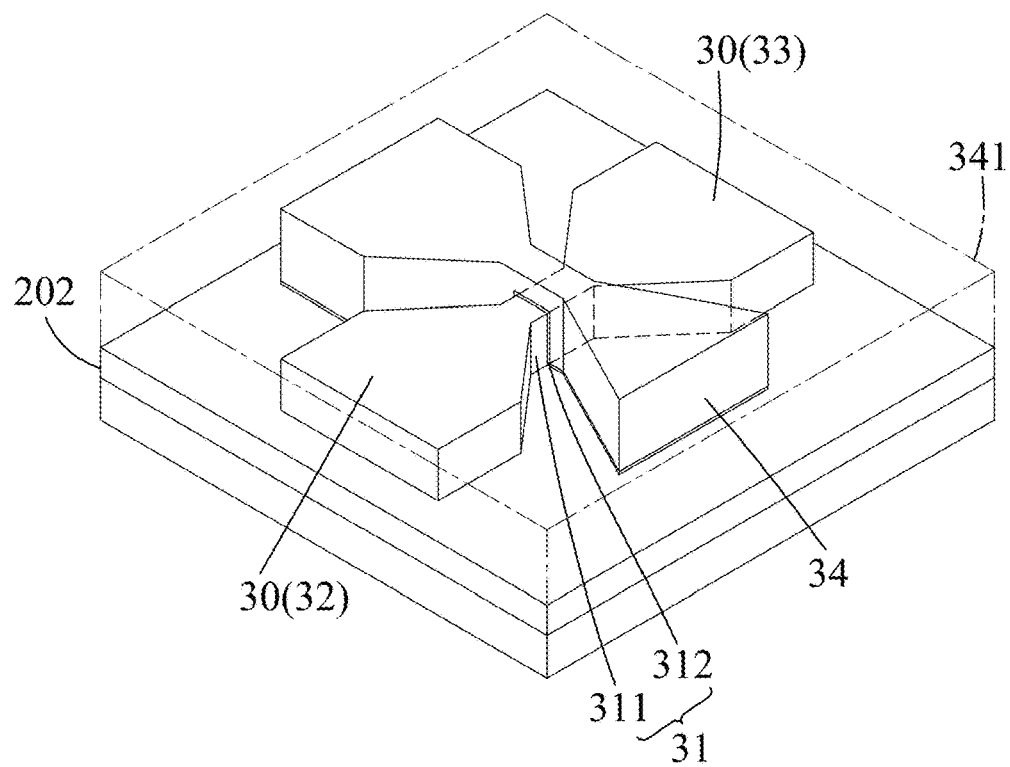

A method for manufacturing the first embodiment of the FeFET device of FIG. 1 is shown in FIGS. 6 to 8 and described as follows.

Referring to FIG. 6, the SOI wafer 200, which includes a silicon wafer 201, an insulating layer 202 and a monocrystalline silicon layer 22, is provided. Then, the SOI wafer 200 is subjected to a reactive ion etching (RIE) process to etch portions of the monocrystalline silicon layer 22, such that a surface 21 of the insulating layer 202 opposite to the silicon wafer 201 is exposed, and a fin structure 221 extending along the first direction (X) is formed. The fin structure 221 defines two opposite regions 30 for subsequent formation of the drain and source electrodes 32, 33, and a connecting region 301 interconnecting therebetween for subsequent formation of the channel body 311 of the channel structure 3. After the RIE process, the etched SOI wafer 200 having the fin structure 221 formed thereon is washed by a RCA cleaning process.

Referring to FIG. 7, the etched SOI wafer 200 is placed in a reactive chamber of an atomic layer deposition (ALD) apparatus to perform ALD cycles, so as to form the gate dielectric layer 312 covering the connecting region 301. Each of the ALD cycles is conducted by sequentially introducing a hafnium precursor (such as tetrakis(dimethylamino)hafnium, $C_8H_{24}HfN_4$) and a zirconium precursor (such as tetrakis(dimethylamino)zirconium, $C_8H_{24}N_4Zr$) into the reactive chamber. The gate dielectric layer 312 is made of HZO. The gate dielectric layer 312 becomes thicker with increasing number of the ALD cycles. In this embodiment, the gate dielectric layer 312 is formed by repeating 12 ALD cycles and has a thickness of 2 nm.

In a first variation of the first embodiment, the gate dielectric layer 312 having a thickness of 3 nm is formed by repeating 18 ALD cycles. In a second variation of the first embodiment, the gate dielectric layer 312 having a thickness of 5 nm is formed by repeating 30 ALD cycles.

Referring to FIG. 8, a tantalum nitride (TaN) layer 341 having a thickness of 120 nm is formed on the gate dielectric layer 312 and the insulating layer 202 by a physical vapor deposition (PVD) process. The TaN layer 314 is then patterned to expose the two regions 30 of the fin structure 221 and to form a gate electrode 34 that extends along the second direction (Y).

The two exposed regions 30 of the fin structure 221 are then doped with a dopant (such as $P^{31}$) at a doping concentration of $1 \times 10^{15}/cm^2$ by virtue of an ion implantation process at 10 keV so as to form the drain electrode 32 and the source electrode 33. The undoped connecting region 301 of the fin structure 221 forms the channel body 311. The channel body 311 and the gate dielectric layer 312 cooperatively form a channel structure 31. Finally, the resulted structure is subjected to a rapid thermal annealing (RTA) process at a temperature ranging from 600° C. to 750° C. for 30 seconds, thereby obtaining the first embodiment of the FeFET device, and the variations thereof. Specifically, for obtaining the first embodiment having the gate dielectric layer 312 with a thickness of 2 nm, the RTA process is conducted at 750° C. For obtaining the first and second variations of the first embodiment having the gate dielectric layers 312 with a thickness of 3 nm and 5 nm, respectively, the RTA processes are conducted at 650° C. and 600° C., respectively.

Figure 9:
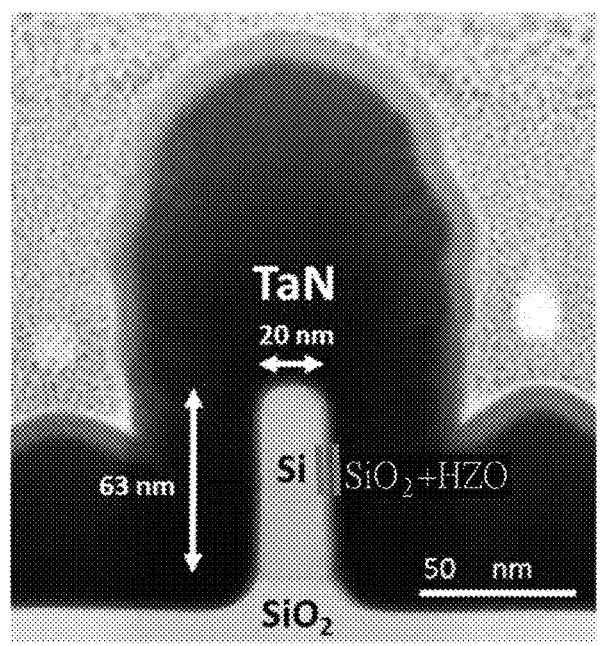
FIG. 9 is a transmission electron microscopy (TEM) image showing the size of a channel structure of the first embodiment.

Referring to FIG. 9, the TEM image of the first embodiment shows that the channel body 311 (depicted as Si) has a channel width ($W_{Ch}$) of 20 nm, and the gate dielectric layer 312 (HZO) covers the channel body 311 which has a height of 63 nm. It should be noted that, a layer of native oxide ($SiO_2$) may be inevitably formed between the channel body 311 and the gate dielectric layer 312 during the manufacturing of the FeFET device of this disclosure.

Figure 10:
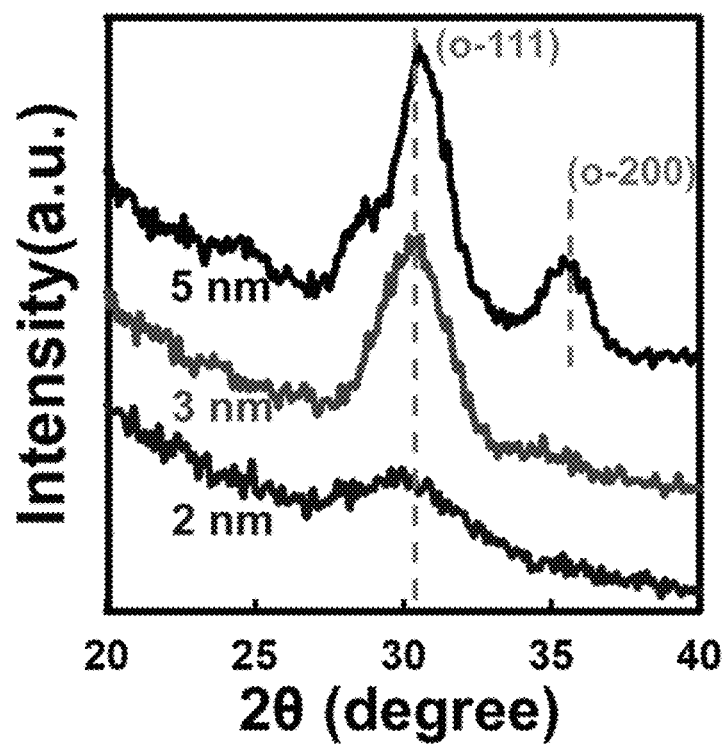
FIG. 10 is a grazing incident X-ray diffraction (GI-XRD) spectrum of a gate dielectric layer of the first embodiment.

Referring to FIG. 10, the GI-XRD spectra of the gate dielectric layer 312 of the first embodiments (2 nm), and the first variation (3 nm) and the second variation (5 nm) thereof show appearance of a (111) peak corresponding to an orthorhombic phase of the gate dielectric layer 312. In particular, the second variation of the first embodiment has (111) and (200) peaks, showing preferred orientations of the gate dielectric layer 312 thereof. These results indicate that the gate dielectric layer 312 of each of the first embodiment and the variations thereof is made of hafnium zirconium oxide (HZO) having the orthorhombic phase.

Figure 11:
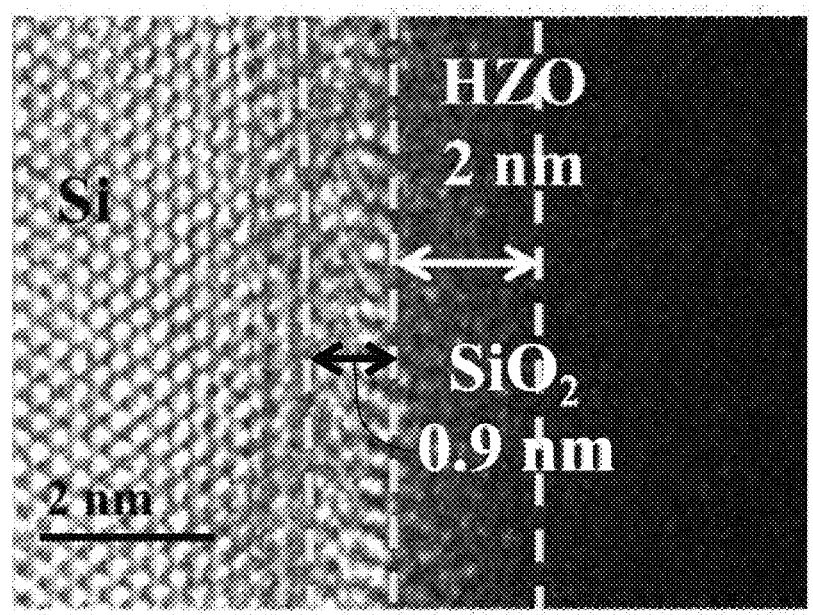
FIGS. 11 to 13 are high resolution TEM (HRTEM) images showing a gate dielectric layer of each of the first embodiment, and first and second variations of the first embodiment, respectively.
Figure 12:
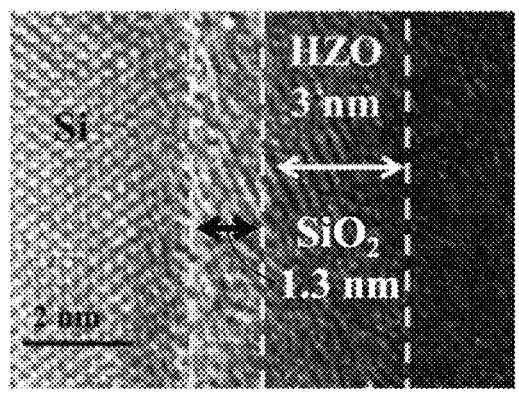
Figure 13:
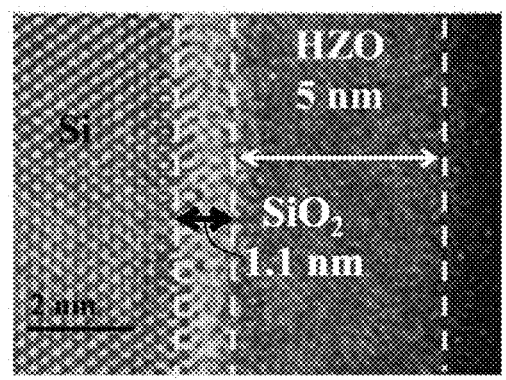
Figure 14:
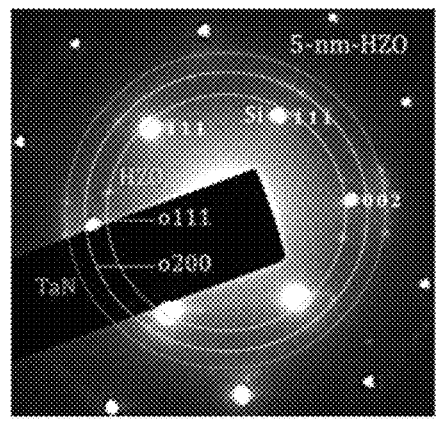
FIG. 14 is an image showing a nanobeam electron diffraction (NBD) pattern of the gate dielectric layer of the second variation of the first embodiment.

Referring to FIGS. 11 to 13, the HRTEM images show the native oxide ($SiO_2$) layer in a respective one of the first embodiment, and the first and second variations thereof has a thickness of 0.9 nm, 1.3 nm and 1.1 nm, respectively. Further, the NBD pattern of the second variation of the first embodiment shows diffraction rings for (111) and (200) planes in the reciprocal space, indicating that the gate dielectric layer 312 having a thickness of 5 nm is a polycrystalline structure in an orthorhombic phase (see FIG. 14).

Figure 15:
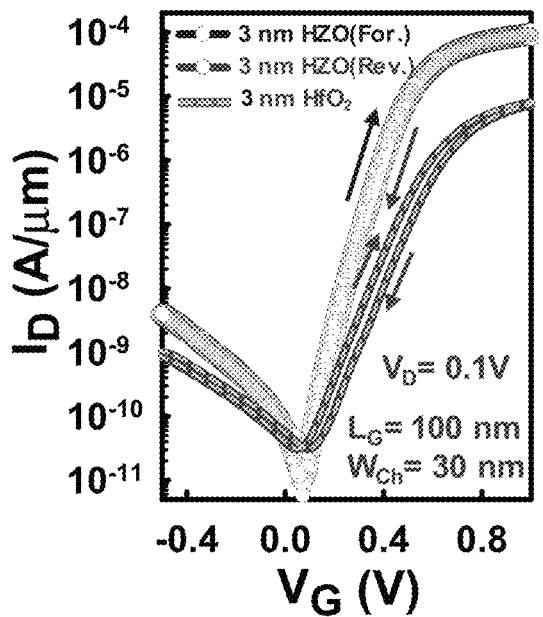
FIG. 15 is a graph showing a transfer characteristic of the first variation of the first embodiment.

Referring to FIG. 15, a transfer characteristic of the first variation of the first embodiment, which has a gate length ($L_G$) of 100 nm and a channel width ($W_{Ch}$) of 30 nm, is measured under a drain voltage ($V_D$) of 0.1 V. For comparison purpose, a comparative FeFET device is used, which has a similar structure as the first embodiment, except that the gate dielectric layer is made of $HfO_2$ and has a thickness of 3 nm. As shown in FIG. 15, as compared to the comparative FeFET device, the first variation of the FeFET device exhibits nearly hysteresis-free transfer curves in forward and reverse sweeps. In addition, the first variation of the first embodiment has an average subthreshold swing (SS) of 50 mV/dec and an $I_{ON}/I_{OFF}$ of $8 \times 10^6$.

Figure 16:
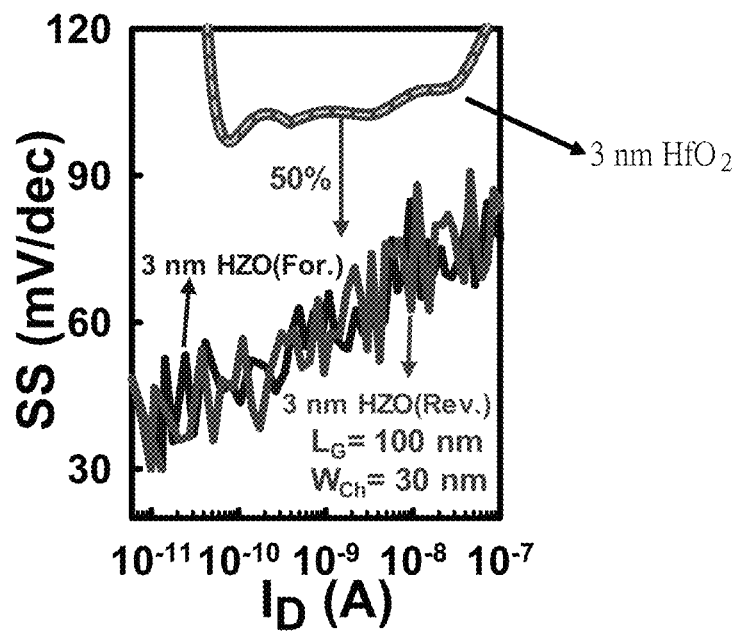
FIG. 16 is a graph showing a relationship between sub-threshold swings (SS) and drain currents ($I_D$) of the first variation of the first embodiment.

FIG. 16 shows a relationship between SS and the drain current ($I_D$) of the first variation of the FeFET device and the comparative FeFET device. It can be seen that, as compared with the comparative FeFET device, the SS values of the first variation of the FeFET device in the forward and reverse sweeps are both lower than 60 mV/dec when the drain current ($I_D$) is lower than $2 \times 10^{-9}$ A, and decrease by 50% relative to those of the comparative FeFET device. This result indicates that the gate dielectric layer 312 of the FeFET device is capable of exhibiting polarization reversal to effectively reduce the SS value, thereby conferring the FeFET device of this disclosure with an improved controllability of the gate electrode 34.

Figure 17:
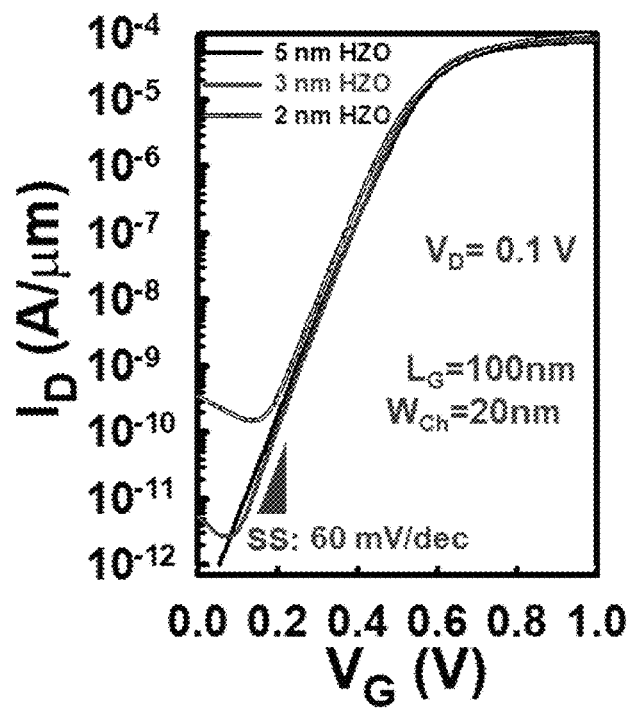
FIG. 17 is a graph showing transfer characteristics of the first embodiment, and the first and second variations thereof.
Figure 18:
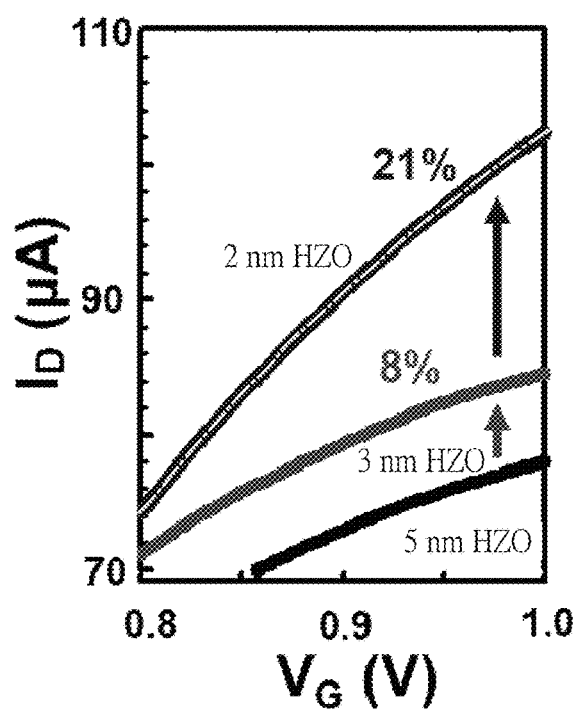
FIG. 18 is an enlarged linear graph of FIG. 17.

Referring to FIGS. 17 and 18, the transfer characteristics of the first embodiment, and the first and second variations thereof, each of which has a gate length ($L_G$) of 100 nm and a channel width ($W_{Ch}$) of 20 nm, are measured under a drain voltage ($V_D$) of 0.1 V. As shown in FIGS. 17 and 18, under the same gate voltage ($V_G$), the drain current ($I_D$) of the first embodiment (the gate dielectric layer 312 having a thickness of 2 nm) is higher than that of the first variation (the gate dielectric layer 312 having a thickness of 3 nm), and the drain current ($I_D$) of the first variation is higher than that of the second variation (the gate dielectric layer 312 having a thickness of 5 nm), indicating that the drain current increases as the thickness of the gate dielectric layer 312 is being reduced due to the thinner equivalent oxide thickness (EOT) of the FeFET device. In particular, the on current of the gate dielectric layer 312 of the first variation which has a thickness of 3 nm increases 8% relative to that of the gate dielectric layer 312 of the second variation which has a thickness of 5 nm, and the on current of the gate dielectric layer 312 of the first embodiment which has a thickness of 2 nm increases 21% relative to that of the gate dielectric layer 312 of the first variation which has a thickness of 3 nm.

Figure 21:
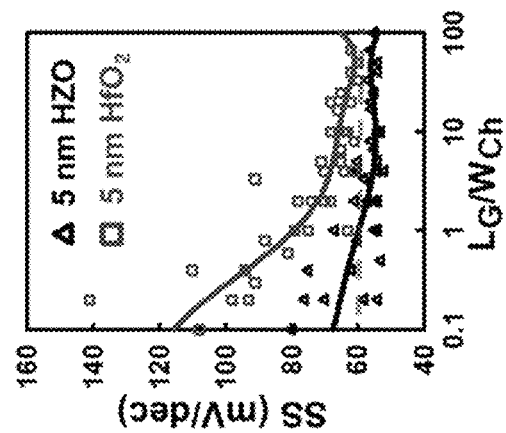
FIGS. 19 to 21 are graphs showing SS as a function of a ratio of gate length ($L_G$) to channel width ($W_{Ch}$) determined in the first embodiment, and the first and second variations thereof, respectively.
Figure 20:
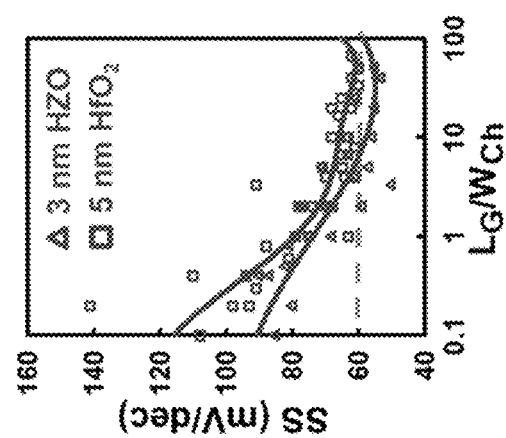
Figure 19:
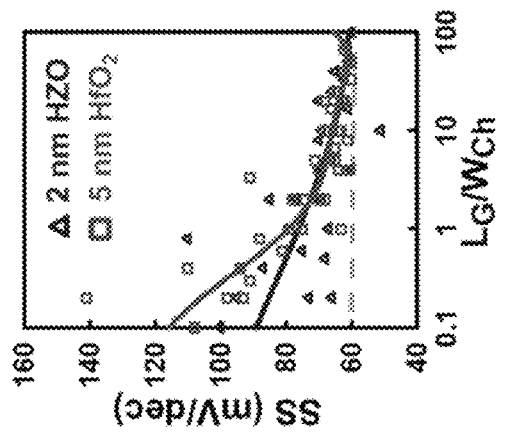

FIGS. 19 to 21 respectively show a relationship of SS value with the ratio of $L_G$ to $W_{Ch}$ (i.e., $L_G/W_{Ch}$) for the first embodiment, and the first and second variations thereof. For comparison purpose, a comparative FeFET device, which has a similar structure as the first embodiment except that the gate dielectric layer is made of $HfO_2$ and has a thickness of 5 nm, is used to conduct the same test. It is noted that as compared to the comparative FeFET device, the first embodiment, and the first and second variations thereof have lower SS values. In particular, the second variation with the greatest thickness of the gate dielectric layer 312 has the lowest SS value due to its high polarization reversal effect, and the SS value thereof can be lowered to be less than 60 mV/dec when $L_G/W_{Ch}$ is equal to 1, in which the SS value reduces as the $L_G/W_{Ch}$ increases. That is, SS values of the FeFET device of this disclosure can be effectively lowered to be below 60 mV/dec by increasing $L_G/W_{Ch}$.

Figure 24:
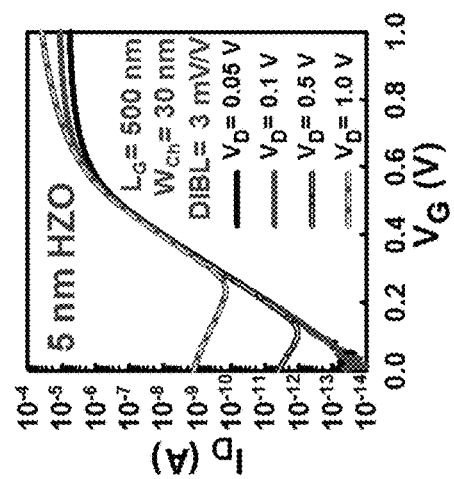
FIGS. 22 to 24 are graphs respectively showing transfer characteristics of the first embodiment, and the first and second variations thereof at different drain voltages.
Figure 23:
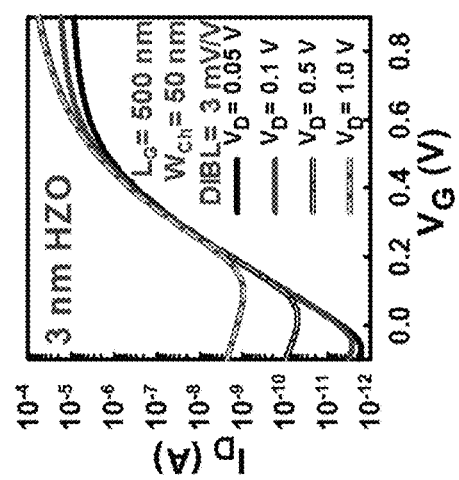
Figure 22:
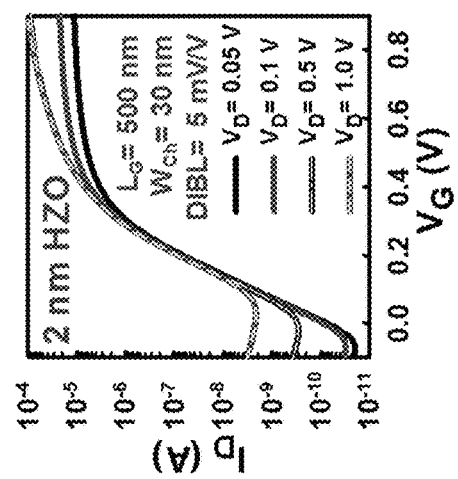

Referring to FIGS. 22 to 24, the transfer characteristics of the first embodiment, and the first and second variations thereof, each of which has a gate length ($L_G$) of 500 nm and a channel width ($W_{Ch}$) of 30 nm, are measured under different drain voltages ($V_D$) (i.e., 0.05 V, 0.1 V, 0.5 V and 1.0 V). The first embodiment, and the first and second variations thereof may have a negative drain-induced barrier lowering (DIBL) effect causing a reduced DIBL value to be lowered to 3 mV/V to 5 mV/V. With increased drain voltages ($V_D$), the negative charges in the channel structure 31 may disappear, resulting in reduction of the total charge therein. By reducing the charges in the channel structure 31, the capacitance-matching of the FeFET device at the same gate voltage is restrained, thereby reducing the current gain caused by polarization reversal.

The abovementioned results demonstrate that by virtue of the gate dielectric layer 312 made of hafnium zirconium oxide (orthorhombic phase) and having a thickness ranging from 2 nm to 5 nm, the first embodiment of the FeFET device, as well as the variations thereof, may have an on/off current ratio ($I_{ON}/I_{OFF}$) larger than $10^6$, and a reduced DIBL that is almost zero due to the negative DIBL effect observed therein. Therefore, the FeFET device of this disclosure is suitable for use in integrated circuits with ultra low power consumption and in integrated circuits for high speed logic computing.

Figure 25:
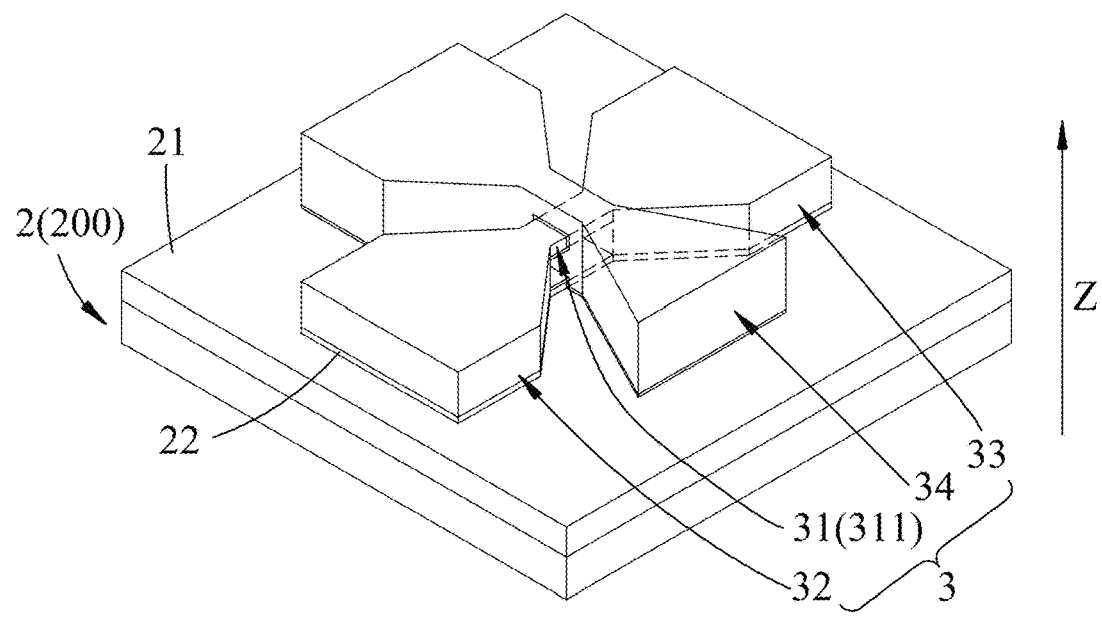
FIG. 25 is a schematic view illustrating a second embodiment of the FeFET device according to the disclosure.
Figure 26:
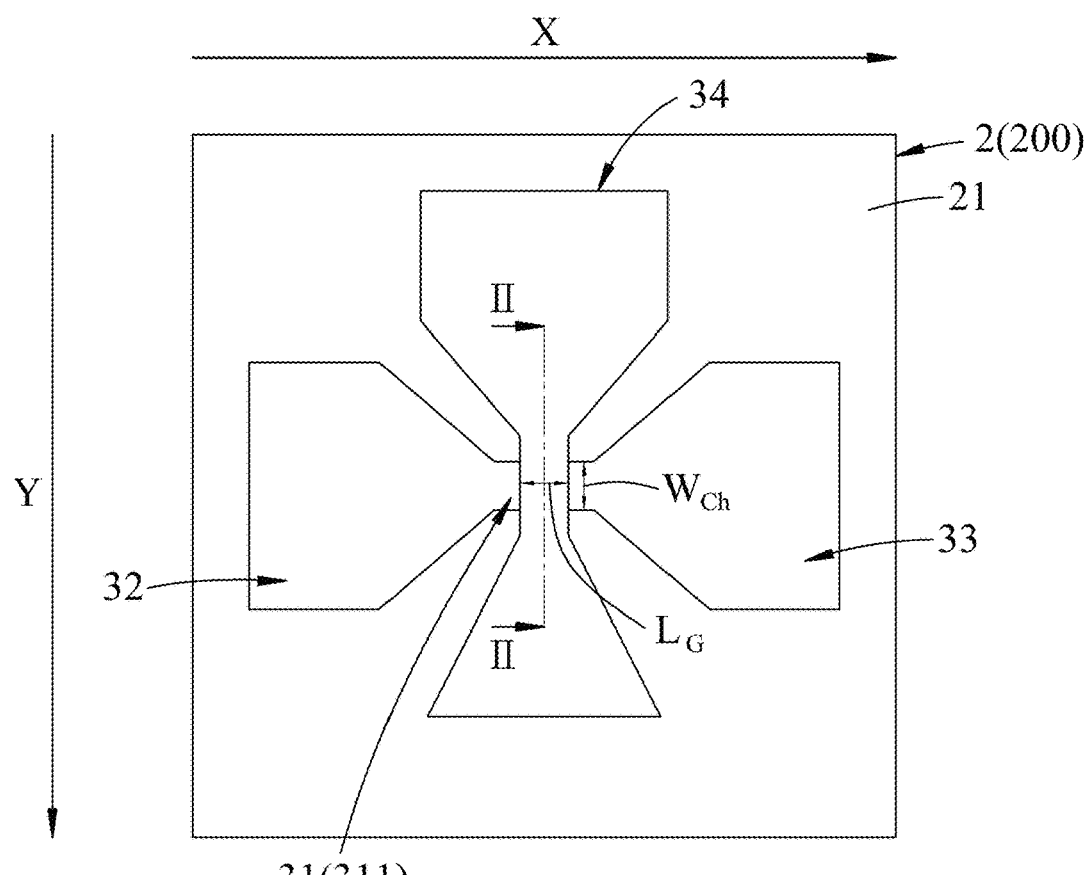
FIG. 26 is a top view of the second embodiment.
Figure 27:
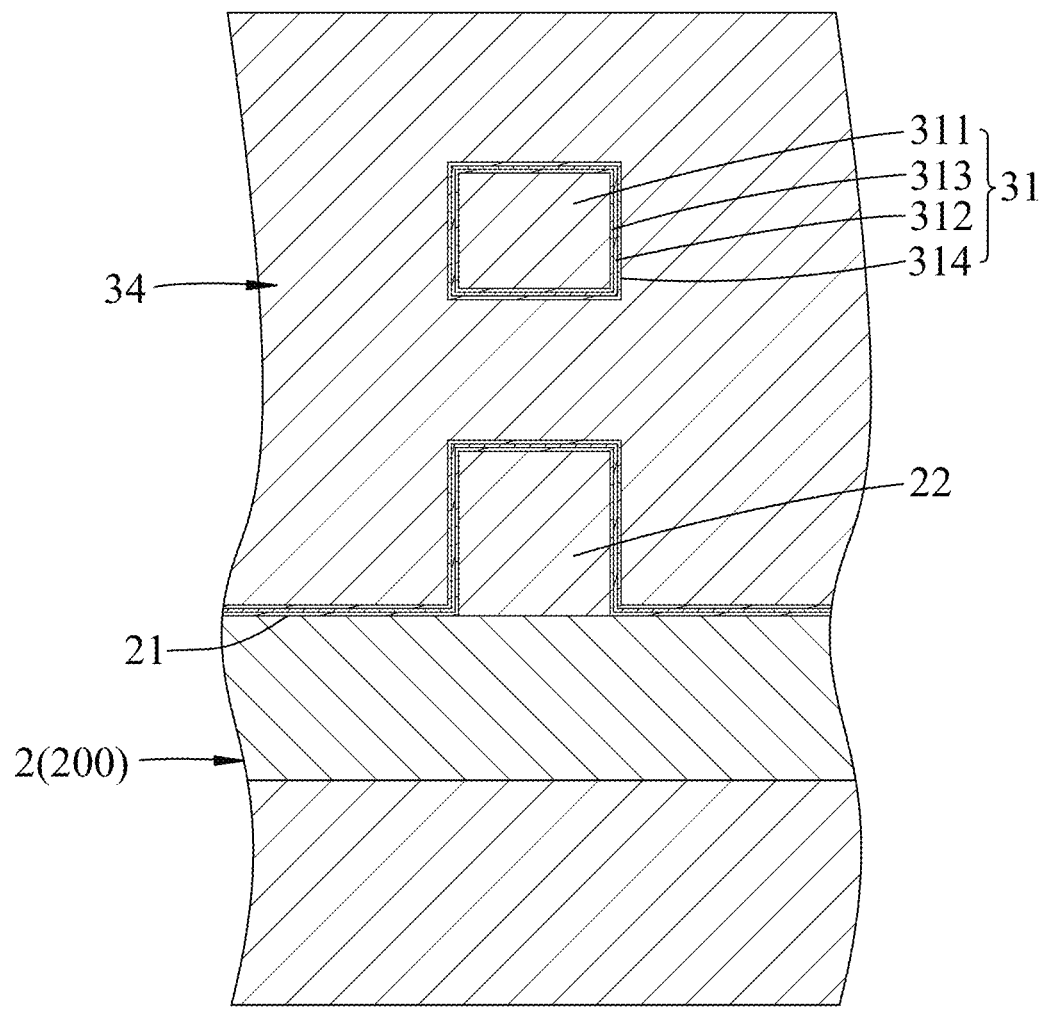
FIG. 27 is a cross sectional view of the second embodiment taken along line II-II of FIG. 26.

Referring to FIGS. 25 to 27, a second embodiment of the FeFET device according to the disclosure is generally similar to the first embodiment of the FeFET device, except for the configuration of the channel structure 31, and the materials for making the channel body 311, the drain electrode 32 and the source electrode 33.

Specifically, in the second embodiment, the channel body 311 is spaced apart from the semiconductor substrate 2 in the direction (Z) away from the semiconductor substrate 2 and is surrounded by the gate dielectric layer 312. The gate electrode 34 surrounds the gate dielectric layer 312, thereby forming a gate-all-around FeFET (GAA FeFET) structure. In addition, the channel body 311 of the channel structure 31 is made of germanium, and the drain electrode 32 and the source electrode 33 are made of germanium doped with an impurity. The second embodiment of the FeFET device may have an on/off current ratio ($I_{ON}/I_{OFF}$) greater than $10^5$.

In certain embodiments, the channel structure 31 further includes a buffer layer 313 disposed between the channel body 311 and the gate dielectric layer 312. The buffer layer 313 may be made of germanium oxide ($GeO_2$). The buffer layer 313 may have a thickness that is equal to or smaller than 1 nm.

In other embodiments, the channel structure 31 further includes a barrier layer 314 disposed between the gate dielectric layer 312 and the gate electrode 34. The barrier layer 314 may be made of aluminum oxide ($Al_2O_3$), and may have a thickness that is equal to or smaller than 3 nm.

A method for manufacturing the second embodiment of the FeFET device is shown in FIGS. 28 to 31 and described as follows.

Figure 28:
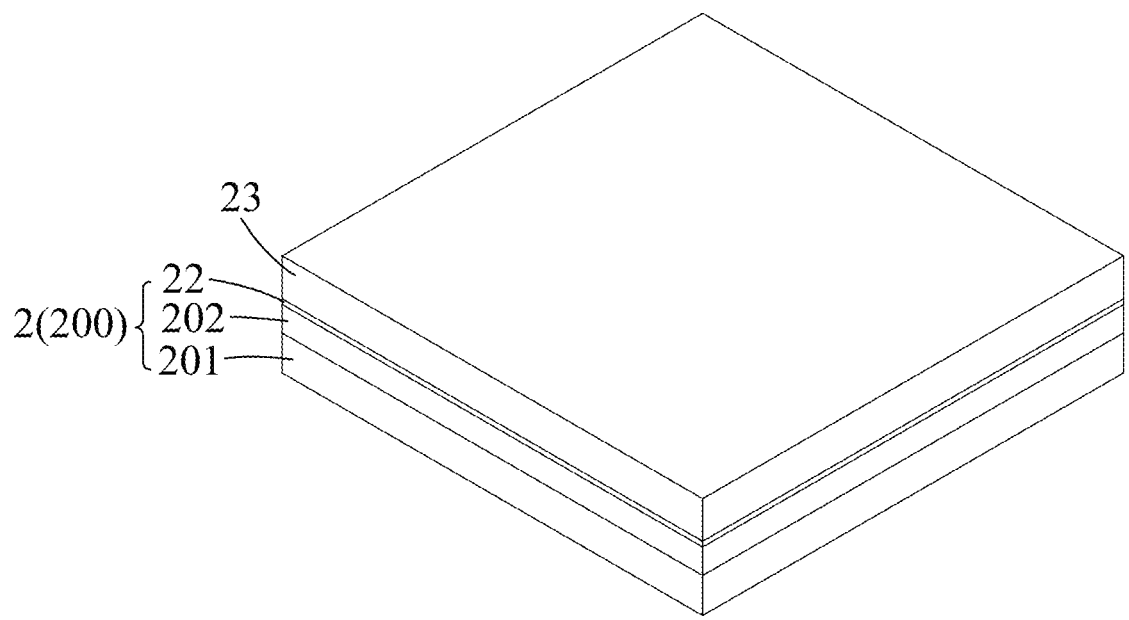
FIGS. 28 to 31 are schematic views illustrating consecutive steps for forming the second embodiment of the FeFET device according to the disclosure.

First, referring to FIG. 28, the SOI wafer 200, which is the same as that of the first embodiment, is placed in a reactive chamber of a metal organic chemical vapor deposition (MOCVD) apparatus. By introducing germane ($GeH_4$) as a precursor in the reactive chamber of the MOCVD apparatus, a monocrystalline germanium (Ge) layer 23 having a thickness of 80 nm is formed on the SOI wafer 200.

Figure 29:
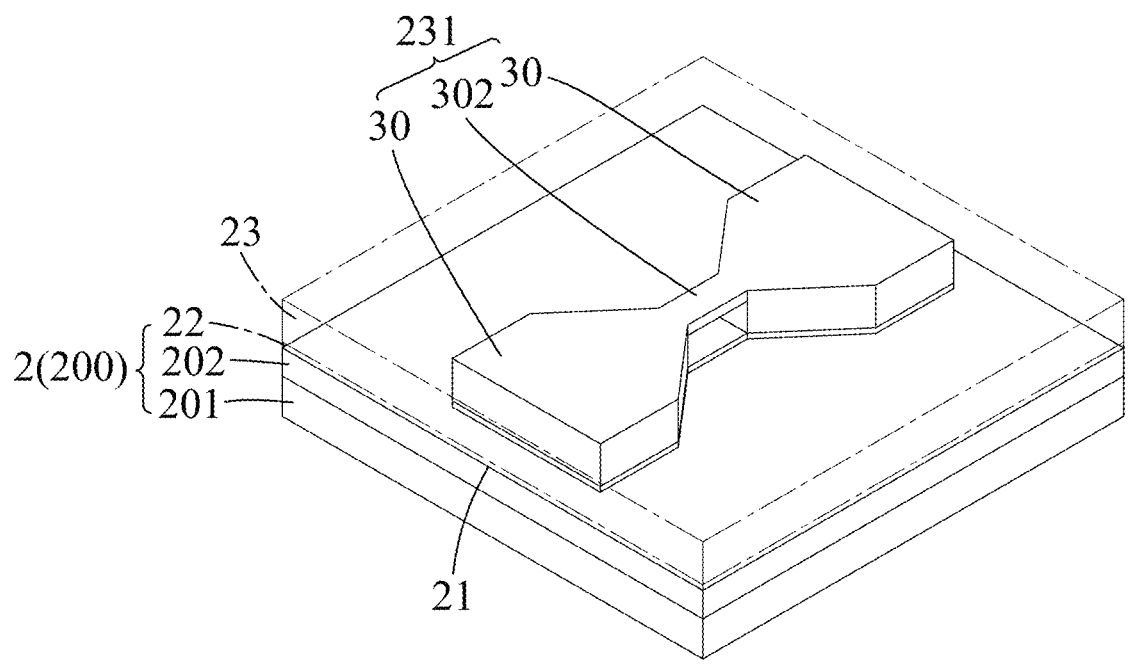

Next, referring to FIG. 29, the Ge layer 23 and the SOI wafer 200 are subjected to a selective RIE process to etch portions of the Ge layer 23 and the monocrystalline silicon layer 22, such that the surface 21 of the insulating layer 202 is exposed, and a bridge structure 231 extending along the first direction (X) is formed on the surface 21. The bridge structure 231 defines two opposite regions 30 for subsequent formation of the drain and source electrodes 32, 33 and a connecting region 302 interconnecting therebetween for subsequent formation of the channel body 311 of the channel structure 3. Specifically, the selective RIE process is performed as follows. A mask is first disposed on the Ge layer 23 to expose regions of the Ge layer 23 to be etched. Then, a gas mixture containing chlorine ($Cl_2$) and hydrogen bromide (HBr) is introduced into a reactive chamber of the RIE apparatus to form a first plasma containing Cl, H and Br ions. By controlling plasma parameters, the Ge layer 23 is subjected to an isotropic etching process using the first plasma for a first predetermined time, in which lateral etching would stop at {111} planes. Then, by introducing $Cl_2$ into the reactive chamber of the RIE apparatus to form a second plasma containing chloride ions and controlling the plasma parameters thereof, an anisotropic etching is conducted using the second plasma to further etch the Ge layer 23 for a second predetermined time. Finally, by forming the first plasma as mentioned above and controlling the plasma parameters thereof, another isotropic etching is further conducted to etch the Ge layer 23 along the {111} planes, thereby forming the bridge structure 231. After the selective RIE process, the etched SOI wafer 200 having the bridge structure 231 formed thereon is washed by the RCA cleaning process.

Figure 30:
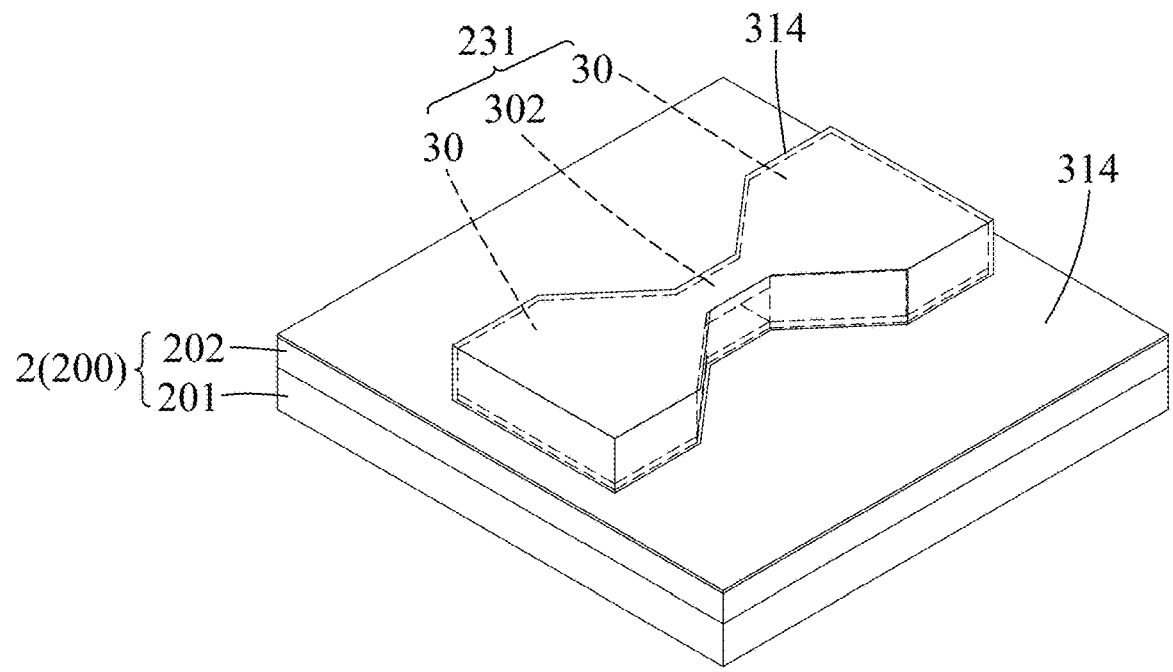

Referring to FIG. 30, the etched SOI wafer 200 is subjected to ALD processes in the reactive chamber of the ALD apparatus so as to sequentially form a buffer layer 313, the gate dielectric layer 312, and a barrier layer 314 on the bridge structure 231 in such order. For the ALD processes, the precursor for forming the buffer layer 313 is ozone ($O_3$), and the precursor for forming the barrier layer 314 is trimethylaluminum ($Al(CH_3)_3$). The procedures for forming the gate dielectric layer 312 in this embodiment is the same as those for making the gate dielectric layer 312 of the first embodiment. In this embodiment, before the ALD process, the bridge structure 231 formed on the etched SOI wafer 200 is subjected to $O_3$ treatment using cyclic digital pulses in advance, so as to reduce roughness and the EOT value of the bridge structure 231.

Figure 31:
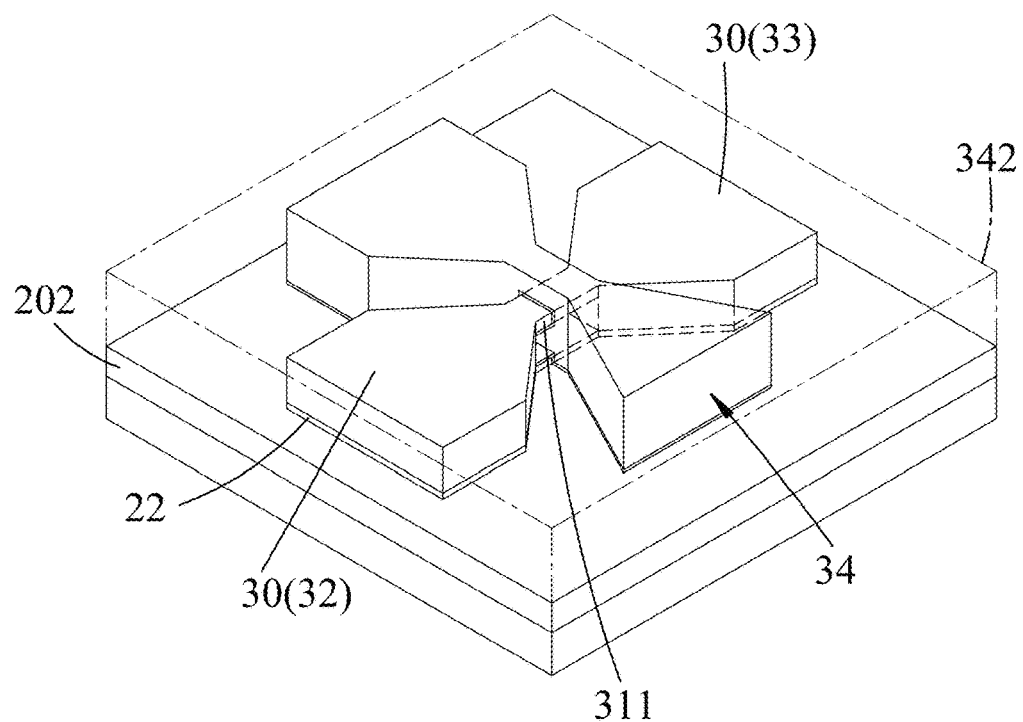

Referring to FIG. 31, a titanium nitride (TiN) layer 342 having a thickness of 80 nm is formed on the barrier layer 314 and the surface 21 of the insulating layer 202 by a physical vapor deposition (PVD) process. The TiN layer 342 is then patterned to expose the two regions 30 of the bridge structure 231 and to form the gate electrode 34 that extends along the second direction (Y).

The two exposed regions 30 of the bridge structure 231 are then doped with a dopant (such as $B^+$) at a doping concentration of $1\times10^{15}/cm^2$ by virtue of the ion implantation at 10 keV so as to form the drain electrode 32 and the source electrode 33. The undoped connecting region 302 of the bridge structure 231 forms the channel body 311. The channel body 311 and the gate dielectric layer 312 cooperatively form a channel structure 31. Finally, the resulted structure is subjected to a microwave annealing (MWA) process at 1650 W for 100 seconds, thereby obtaining the second embodiment of the FeFET device.

In this embodiment, the gate length ($L_G$) of the gate electrode 34 is 60 nm and the channel width ($W_{Ch}$) of the channel body 311 of the channel structure 31 is 20 nm. Additionally, since the Ge layer 23 cannot resist high temperature (<400° C.), the resulted structure in this embodiment is subjected to the MWA process instead of the RTA process in the first embodiment.

Figure 32:
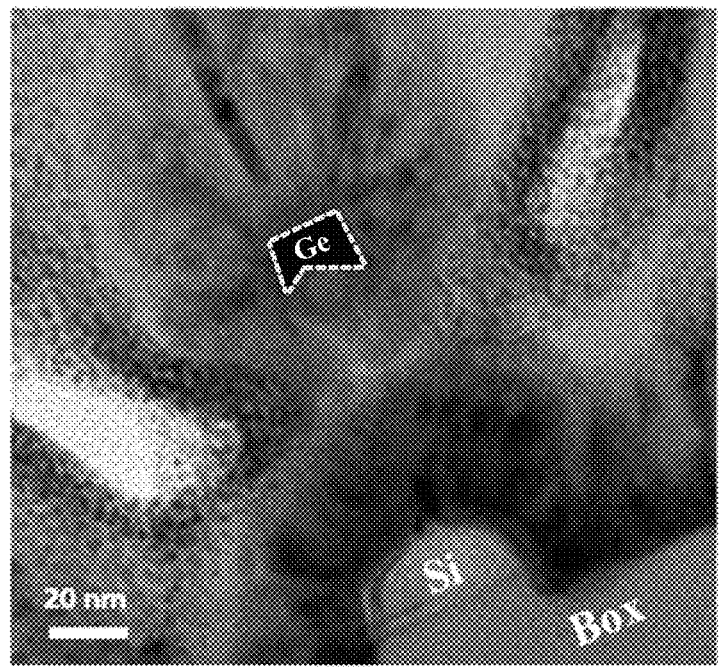
FIG. 32 is a TEM image showing a channel structure of the second embodiment.
Figure 33:
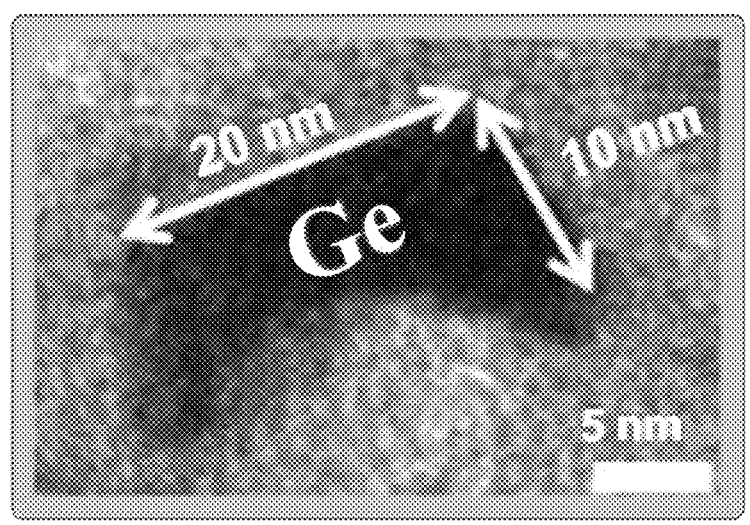
FIG. 33 is an enlarged image of a dotted-line frame shown in FIG. 32.

Referring to FIGS. 32 and 33, the TEM images of the second embodiment show that the channel body 311 (depicted as Ge) has a channel width ($W_{Ch}$) of 20 nm and is spaced apart from the surface 21 of the semiconductor substrate 2 (depicted as Si).

Figure 34:
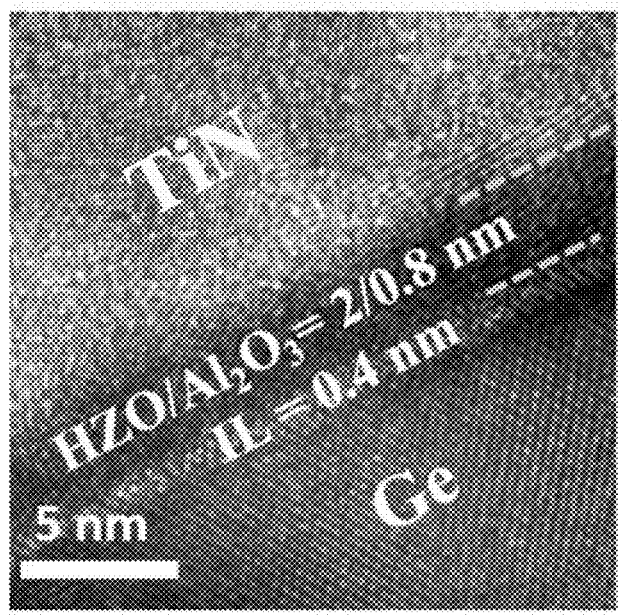
FIG. 34 is a HRTEM image showing a buffer layer, a gate dielectric layer and a barrier layer of the second embodiment.

Moreover, as shown in FIG. 34, the HRTEM image of the second embodiment shows that the thicknesses of the buffer layer 313, the gate dielectric layer 312 and the barrier layer 314, which are abbreviated as "IL", "HZO" and "$Al_2O_3$", are 0.4 nm, 2 nm, and 0.8 nm, respectively.

Figure 35:
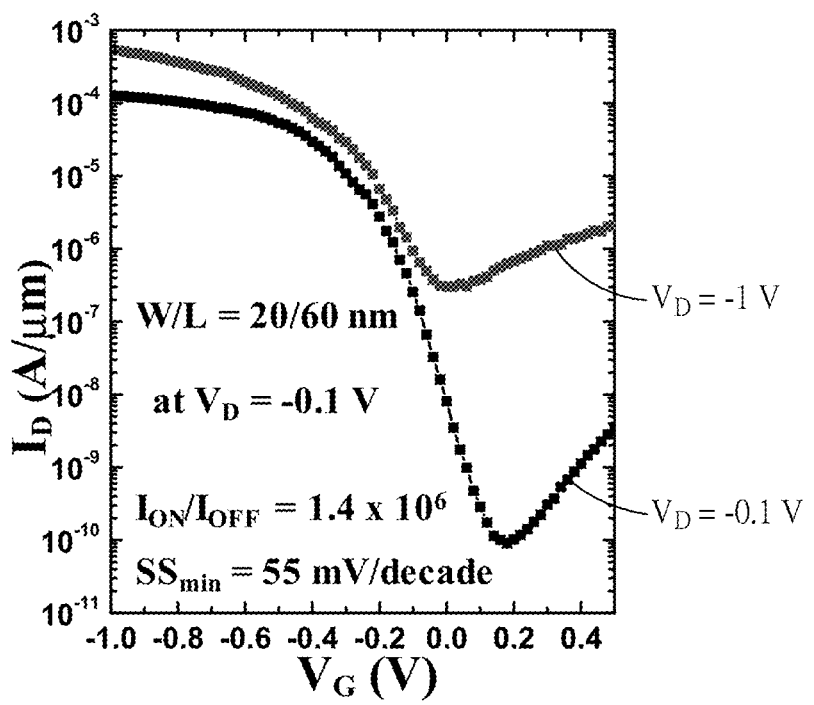
FIG. 35 is a graph showing a transfer characteristic of the second embodiment at different drain voltages.

Referring to FIG. 35, a transfer characteristic of the second embodiment is measured under a fixed drain voltage ($V_D$) of −0.1 V or −1 V. The result shows that the second embodiment has an on/off current ratio ($I_{ON}/I_{OFF}$) of 1.4× $10^6$ and a minimal SS of 55 mV/dec at $V_D$ of −0.1 V.

Figure 36:
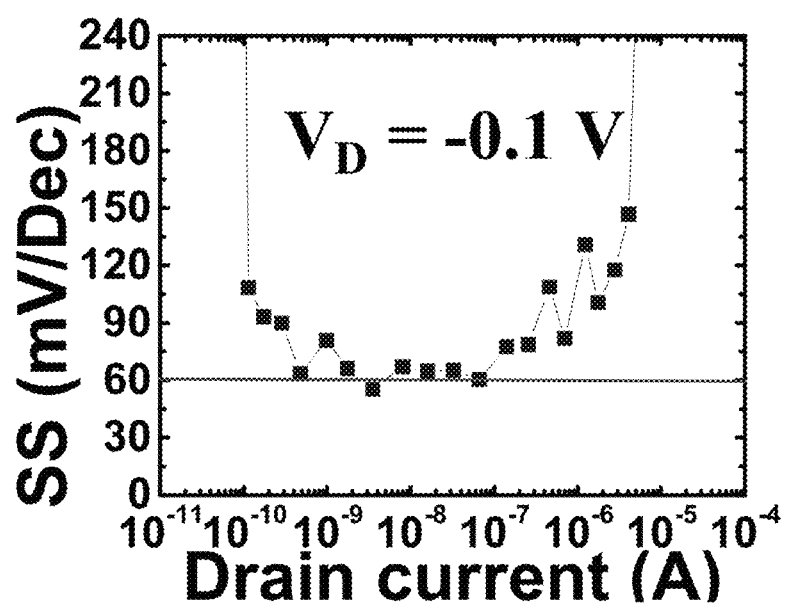
FIG. 36 is a graph showing a relationship between SS and drain current ($I_D$) of the second embodiment.

FIG. 36 shows a relationship between SS and drain current ($I_D$) of the second embodiment at $V_D$ of −0.1 V. As shown in FIG. 36, when the drain current ($I_D$) is within a range of approximately $10^{-7}$ A to approximately $10^{-9}$ A, the second embodiment may have SS of approximately 60 mV/dec.

The abovementioned results demonstrate that since the gate dielectric layer 312 that surrounds the channel body 311 exhibits a polarization reversal effect, the second embodiment of the FeFET device has a SS value that is approximately 60 mV/dec. Further, since the gate dielectric layer 312 surrounds the barrier layer 314 to effectively reduce the leak current of the second embodiment, the $I_{ON}/I_{OFF}$ of the FeFET device is capable of reaching $1.4 \times 10^6$ when $V_D$ is −0.1 V. Therefore, the FeFET device of this disclosure has an excellent controllability of the gate electrode 34.

This disclosure also provides a third embodiment of the FeFET device, which is generally similar to the second embodiment of the FeFET device, except that in the third embodiment, the channel body 311 of the channel structure 31 is made of silicon germanium compound, and the drain electrode 32 and the source electrode 33 are made of silicon germanium compound doped with an impurity.

Figure 37:
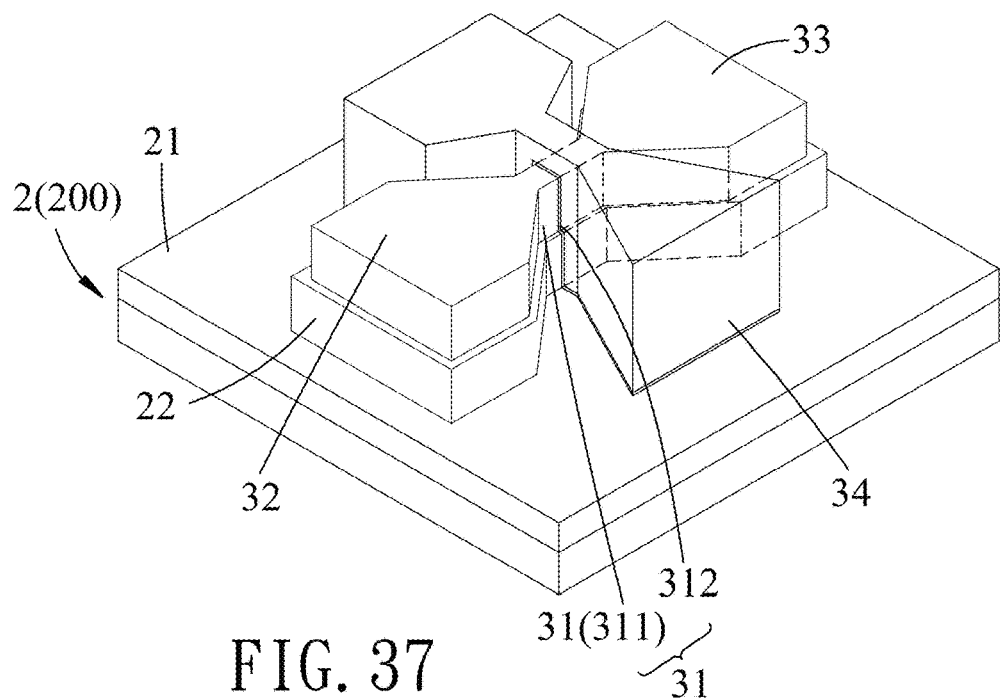
FIG. 37 is a schematic view illustrating a fourth embodiment of the FeFET device according to the disclosure.
Figure 38:
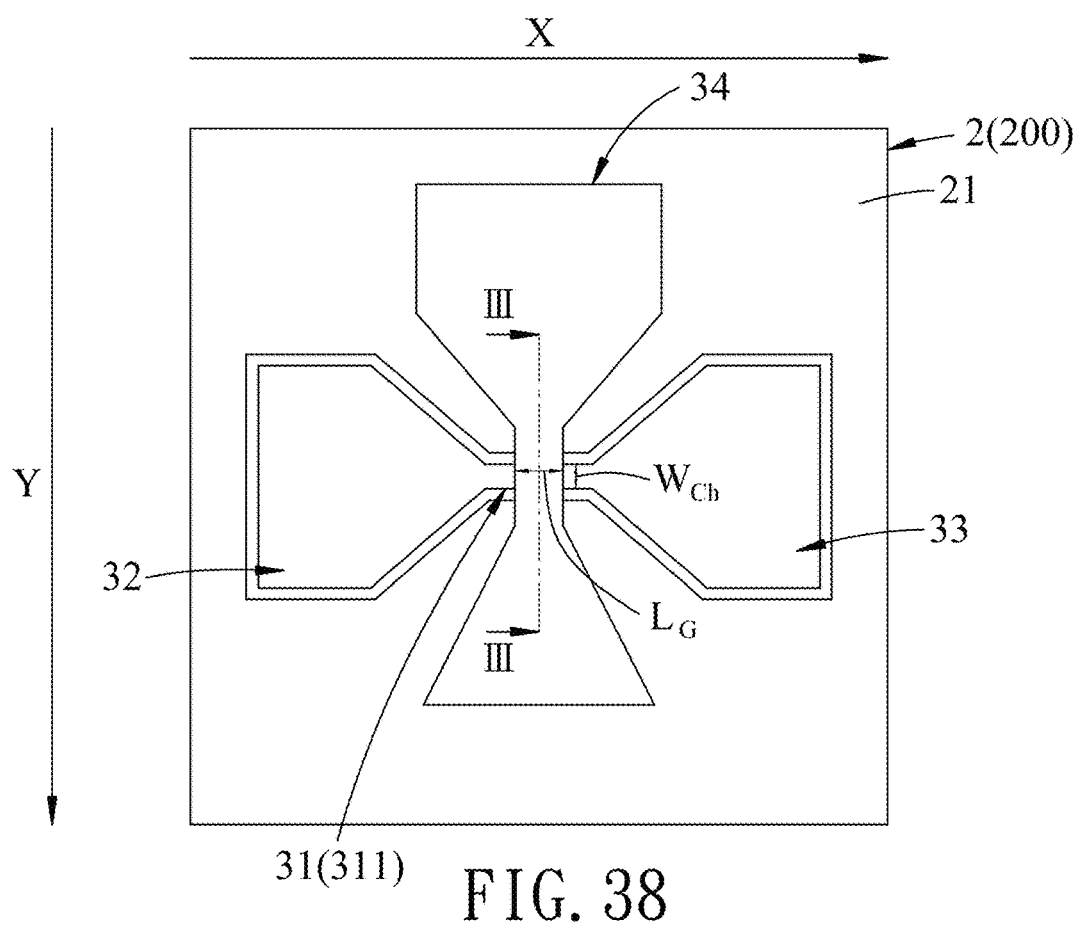
FIG. 38 is a top view of the fourth embodiment.
Figure 39:
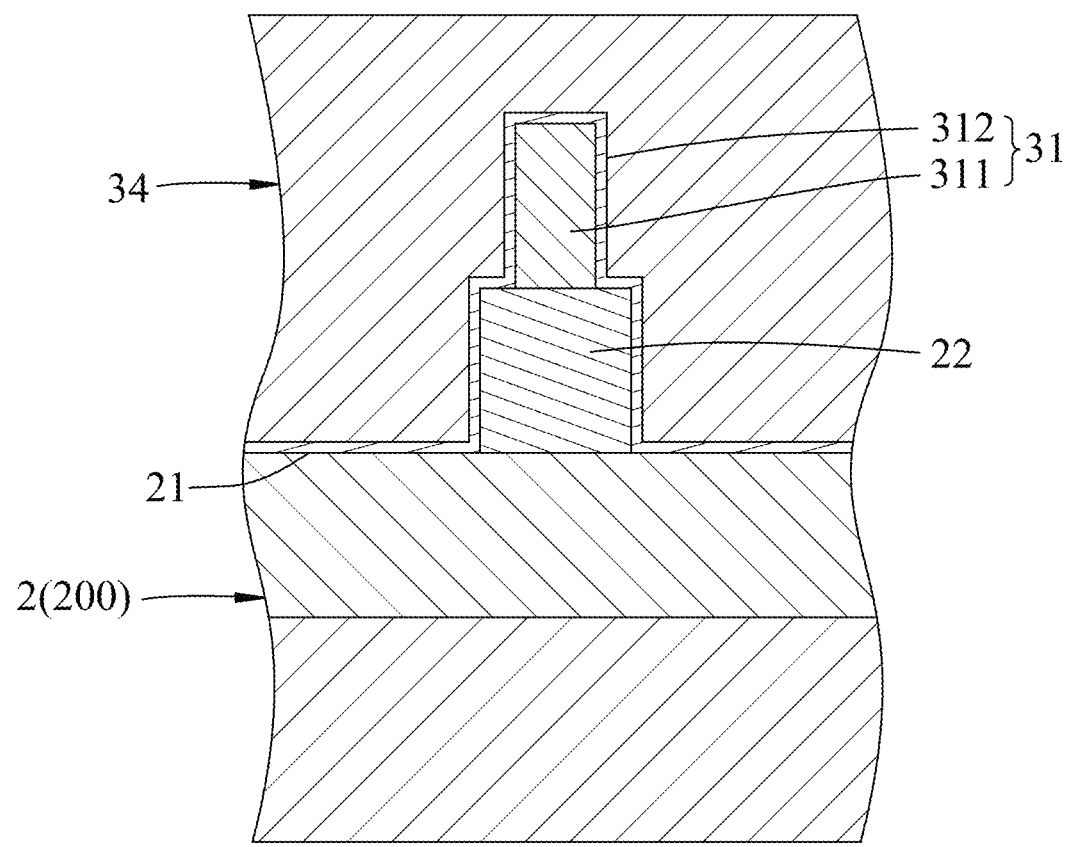
FIG. 39 is a cross sectional view of the fourth embodiment taken along line III-III of FIG. 38.

Referring to FIGS. 37 to 39, a fourth embodiment of the FeFET device according to the disclosure generally similar to the first embodiment of the FeFET device, except that in the fourth embodiment, the channel body 311 of the channel structure 31 is made of silicon germanium compound, and the drain electrode 32 and the source electrode 33 are made of silicon germanium compound doped with an impurity. The fourth embodiment of the FeFET device may have an on/off current ratio ($I_{ON}/I_{OFF}$) greater than $10^6$.

A method for manufacturing the fourth embodiment of the FeFET device is shown in FIGS. 40 to 43 and described as follows.

Figure 40:
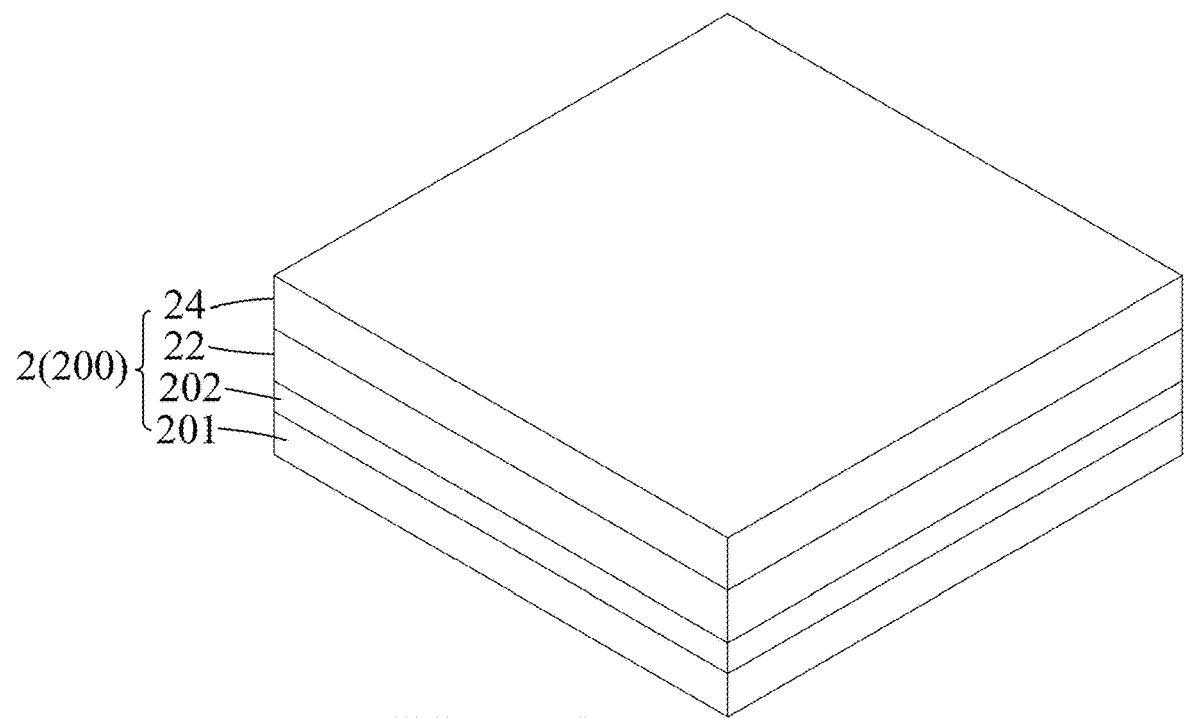
FIGS. 40 to 43 are schematic views illustrating consecutive steps for forming the fourth embodiment of the FeFET device according to the disclosure.

First, referring to FIG. 40, the SOI wafer 200, which is the same as that of the first embodiment, is subjected to an MOCVD process in a reactive chamber of the MOCVD apparatus (not shown in the figure) by introduction of precursors including $GeH_4$ and silane ($SiH_4$) respectively at flow rates of 130 sccm and 22 sccm into the reactive chamber, so as to epitaxially form a monocrystalline silicon germanium layer 24 on the SOI wafer 200. The monocrystalline silicon germanium layer 24 has a thickness of 40 nm and a compositional formula of $Si_{0.8}Ge_{0.2}$ as confirmed by XDR analysis.

Figure 41:
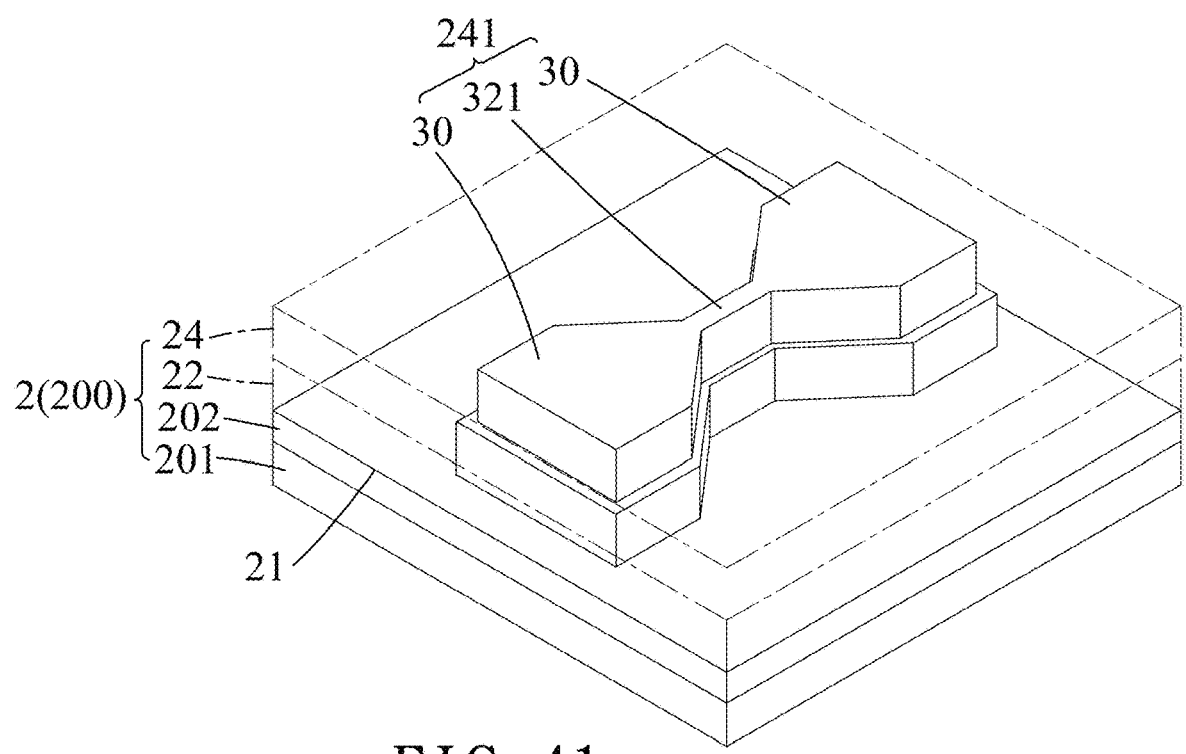

Referring to FIG. 41, the monocrystalline silicon germanium layer 23 and the SOI wafer 200 are subjected to a RIE process to etch portions of the monocrystalline silicon germanium layer 24 and the monocrystalline silicon layer 22, such that the surface 21 of the insulating layer 202 is exposed, and a fin structure 241 extending along the first direction (X) is formed on the surface 21. The fin structure 241 defines two opposite regions 30 for subsequent formation of the drain and source electrodes 32, 33, and a connecting region 321 interconnecting therebetween for subsequent formation of the channel body 311 of the channel structure 3.

Specifically, the RIE process is performed as follows. A mask is first disposed on the monocrystalline silicon germanium layer 24 to expose regions of the monocrystalline silicon germanium layer 24 to be etched. Then, a gas mixture containing hydrogen bromide (HBr) and helium (He) is introduced into a reactive chamber of the RIE apparatus to form a plasma containing Br and He ions. After that, an anisotropic etching process is conducted using the plasma to selectively etch the monocrystalline silicon germanium layer 24 and the monocrystalline silicon layer 22 for a predetermined time, thereby forming the fin structure 241. The etching rate for the monocrystalline silicon layer 22 is relatively slower than the etching rate for the monocrystalline silicon germanium layer 24 during the RIE process, such that a portion of the fin structure 241 formed in the monocrystalline silicon germanium layer 24 is smaller in size than a portion of the fin structure 241 formed in the monocrystalline silicon layer 22. After the RIE process, the etched SOI wafer 200 having the fin structure 241 formed thereon is washed by the RCA cleaning process.

Figure 42:
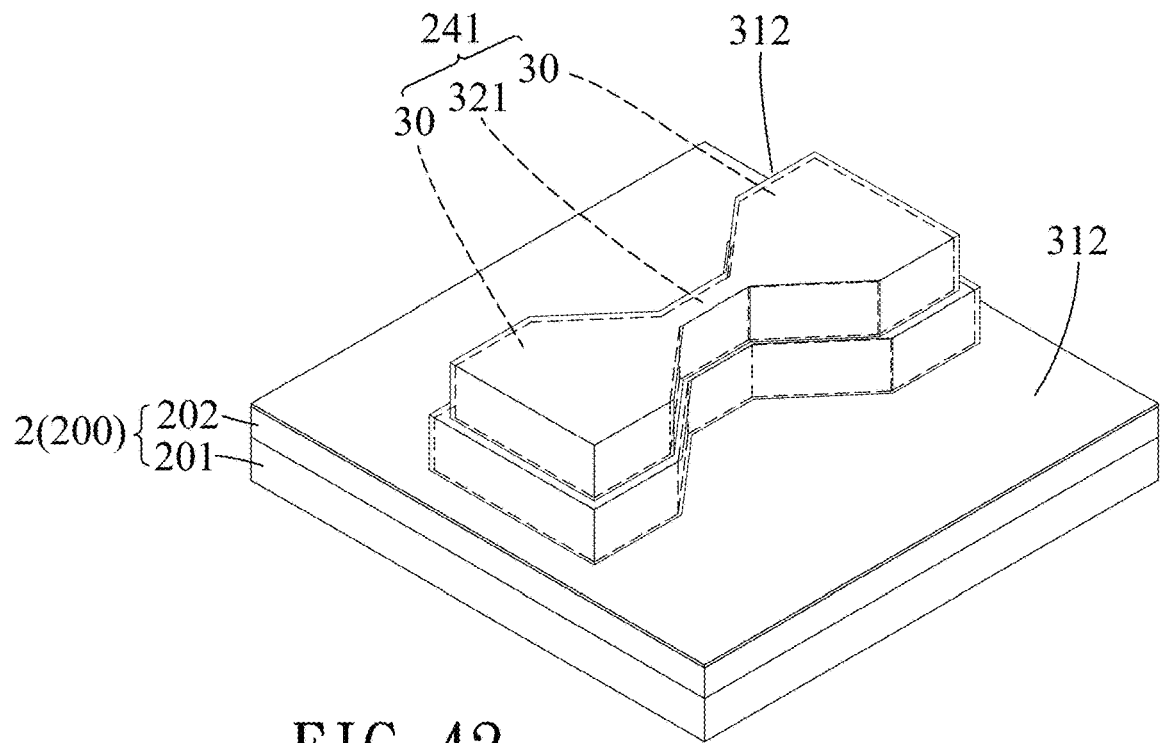

Referring to FIG. 42, the etched SOI wafer 200 having the fin structure 241 formed thereon is subjected to ALD processes in a reactive chamber of the ALD apparatus under conditions as those described in the second variation of the first embodiment, so as to form the gate dielectric layer 312 (having a thickness of 5 nm) covering the fin structure 241 and the surface 21 of the insulating layer 202.

Figure 43:
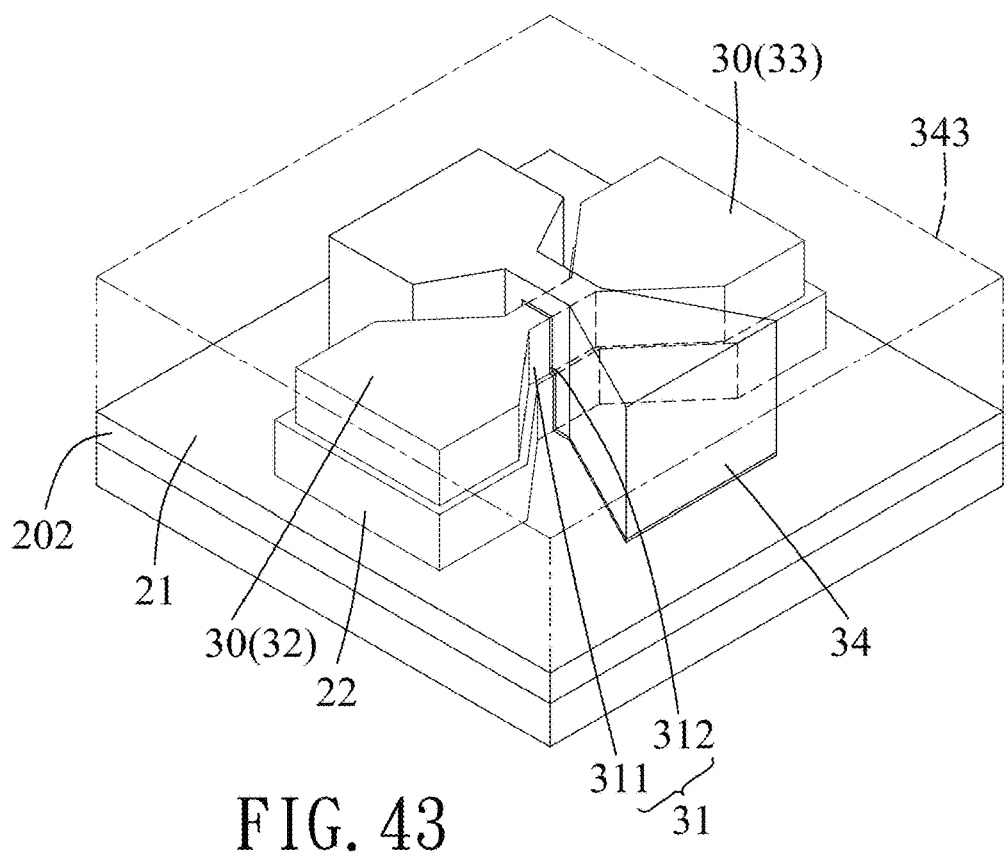

Referring to FIG. 43, a TiN layer 343 having a thickness of 80 nm is formed on the gate dielectric layer 312 by a PVD process. The TiN layer 343 is then patterned to expose the two regions 30 of the fin structure 241 and to form a gate electrode 34 that extends along the second direction (Y).

The two exposed regions 30 on the monocrystalline silicon germanium layer 24 of the fin structure 241 are then doped with a dopant (such as $P^{31}$) at a doping concentration of $1 \times 10^{15}/cm^2$ by virtue of ion implantation at 10 keV so as to form the drain electrode 32 and the source electrode 33. The undoped connecting region 321 of the fin structure 241 forms the channel body 311. The channel body 311 and the gate dielectric layer 312 cooperatively form a channel structure 31. Finally, the doped structure is subjected to RTA process at 550° C. for 30 seconds, thereby obtaining the fourth embodiment of the FeFET device.

Figure 44:
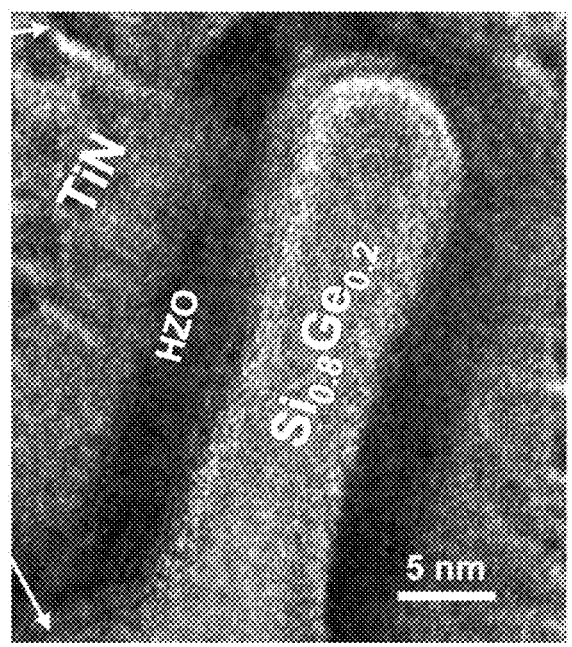
FIG. 44 is a HRTEM image showing a channel structure of the fourth embodiment.

In this embodiment, the gate length ($L_G$) of the gate electrode 34 is 60 nm or 100 nm, and the channel width ($W_{Ch}$) of the channel body 311 of the channel structure 31 is 5 nm. As shown in FIG. 44, the HRTEM image of the fourth embodiment shows that the gate dielectric layer 312 (depicted as HZO) formed by the ALD process has a thickness of approximately 5 nm, and covers the channel body 311 ($Si_{0.8}Ge_{0.2}$) on which the gate electrode 34 (depicted as TiN) is disposed.

Figure 45:
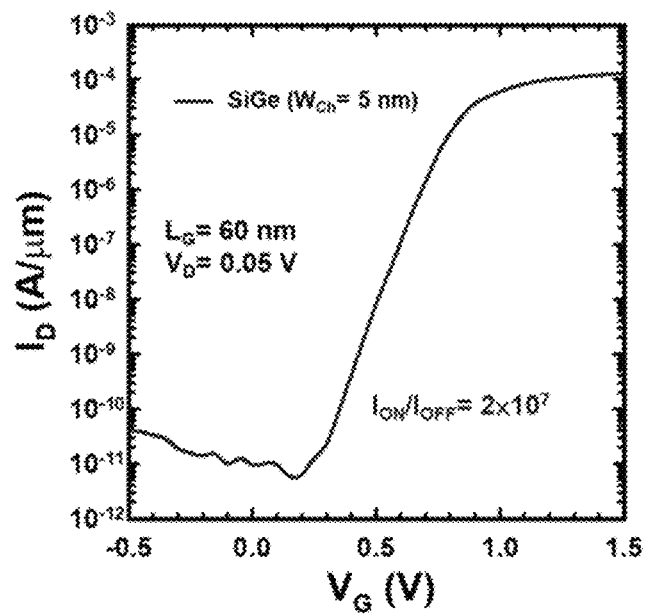
FIGS. 45 and 46 are graphs showing transfer characteristics of the fourth embodiment and a variation thereof, respectively.

Referring to FIG. 45, a transfer characteristic of the fourth embodiment, which has a gate length ($L_G$) of 60 nm and a channel width ($W_{Ch}$) of 5 nm, is measured under the drain voltage ($V_D$) of 0.05 V. The result shows that the fourth embodiment has an on/off current ratio ($I_{ON}/I_{OFF}$) of $2 \times 10^7$.

Figure 46:
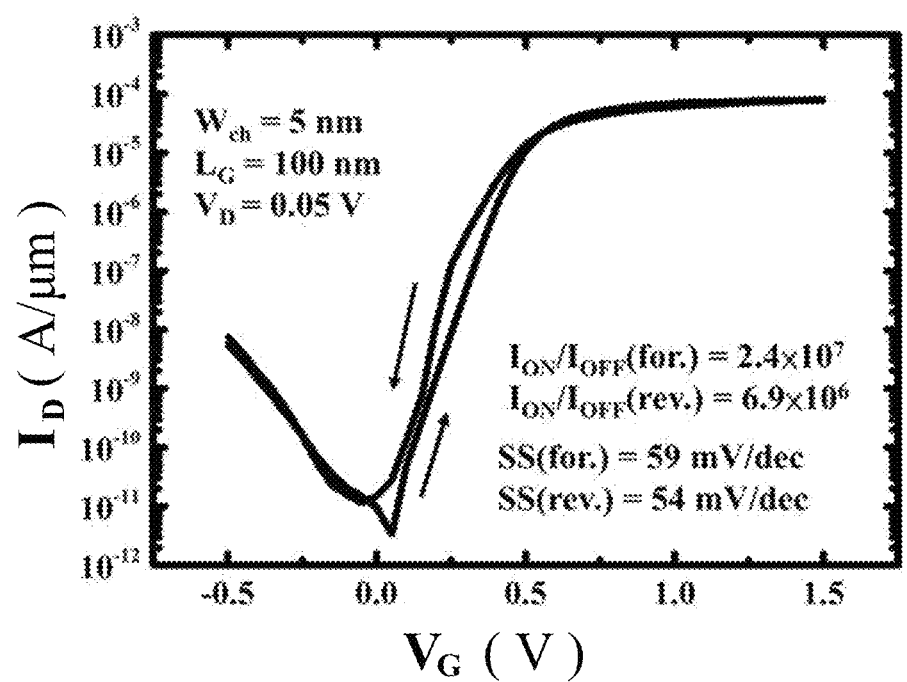

Referring to FIG. 46, a transfer characteristic of the fourth embodiment, which has a gate length ($L_G$) of 100 nm and a channel width ($W_{Ch}$) of 5 nm, is measured under the drain voltage ($V_D$) of 0.05 V. As shown in FIG. 46, in a forward sweep, the fourth embodiment has an on/off current ratio ($I_{ON}/I_{OFF}$) of $2.4 \times 10^7$ and a SS value of 59 mV/dec. In a reverse sweep, the FeFET device has an on/off current ratio ($I_{ON}/I_{OFF}$) of $6.9 \times 10^6$ and a SS value of 54 mV/dec.

In conclusion, by virtue of the gate dielectric layer 312 made of crystalline hafnium zirconium oxide which exhibits polarization reversal characteristic, the FeFET device of this disclosure has an improved electrical properties, such as a reduced SS value (e.g., <60 mV/dec) and an increased $I_{ON}/I_{OFF}$ ratio, so as to achieve an improved controllability of the gate electrode 34. Therefore, the FeFET device of this disclosure is suitable for use in integrated circuits with ultra low power consumption and in integrated circuits for high speed logic computing.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A ferroelectric field effect transistor (FeFET) device, comprising:
    a semiconductor substrate; and
    a three-dimensional transistor including:
        a drain electrode and a source electrode that are disposed on and extend in a direction away from said semiconductor substrate;
        a channel structure that includes a channel body and a gate dielectric layer, said channel body extending in the direction away from said semiconductor substrate and disposed between and connected to said drain electrode and said source electrode, said gate dielectric layer covering said channel body, and being made of crystalline hafnium zirconium oxide and having a thickness ranging from 2 nm to 5 nm; and
        a gate electrode that is disposed on said gate dielectric layer and that is electrically isolated from said drain electrode and said source electrode,
    wherein said ferroelectric FET device has an on/off current ratio that is greater than $5 \times 10^4$, and
    wherein said channel body is surrounded by said gate dielectric layer, and said gate electrode surrounds said gate dielectric layer so that said channel body is spaced apart from said semiconductor substrate in the direction away from said semiconductor substrate via said gate electrode.

2. The FeFET device of claim 1, wherein said channel body of said channel structure is made of a material selected from the group consisting of silicon, germanium and silicon germanium compound, and said source electrode and said drain electrode are made of the material doped with an impurity.

3. The FeFET device of claim 1, wherein said channel body of said channel structure is made of germanium, and said source electrode and said drain electrode are made of germanium doped with an impurity.

4. The FeFET device of claim 1, wherein said FeFET device has an on/off current ratio greater than $10^5$.

5. The FeFET device of claim 1, wherein said channel structure further includes a buffer layer disposed between said channel body and said gate dielectric layer.

6. The FeFET device of claim 5, wherein said buffer layer is made of germanium oxide.

7. The FeFET device of claim 5, wherein said buffer layer has a thickness smaller than 1 nm.

8. The FeFET device of claim 5, wherein said channel structure further includes a barrier layer disposed between said gate dielectric layer and said gate electrode.

9. The FeFET device of claim 8, wherein said barrier layer is made of aluminum oxide.

10. The FeFET device of claim 8, wherein said barrier layer has a thickness smaller than 3 nm.

11. The FeFET device of claim 1, wherein said channel body of said channel structure is made of silicon germanium compound, and said source electrode and said drain electrode are made of silicon germanium compound doped with an impurity.

12. The FeFET device of claim 1, wherein said gate electrode has a gate length measured along a first direction from said drain electrode to said source electrode, said gate length ranging from 10 nm to 500 nm.

13. The FeFET device of claim 12, wherein said channel body has a channel width measured along a second direction that is orthogonal to the first direction, said channel width ranging from 3 nm to 50 nm.

14. The FeFET device of claim 1, wherein said channel body and said gate dielectric layer are embedded in said gate electrode.

* * * * *